US008134209B2

(12) United States Patent
Yagishita et al.

(10) Patent No.: US 8,134,209 B2
(45) Date of Patent: Mar. 13, 2012

(54) SEMICONDUCTOR DEVICE AND METHOD FOR MANUFACTURING THE SAME

(75) Inventors: Atsushi Yagishita, Voorheesville, NY (US); Makoto Fujiwara, Slingerlands, NY (US); Hirohisa Kawasaki, Ballston Spa, NY (US); Mariko Takayanagi, Clifton Park, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 266 days.

(21) Appl. No.: 12/640,658

(22) Filed: Dec. 17, 2009

(65) Prior Publication Data

US 2011/0147839 A1    Jun. 23, 2011

(51) Int. Cl.
 *H01L 27/12* (2006.01)
(52) U.S. Cl. . 257/347; 257/353; 257/401; 257/E29.275; 257/E21.421
(58) Field of Classification Search .......... 257/347, 257/353, 401, E29.275, E21.421; 438/157
See application file for complete search history.

(56) References Cited

U.S. PATENT DOCUMENTS 7,821,061 B2 * 10/2010 Jin et al. .................. 257/331

OTHER PUBLICATIONS

Monfray et al, First 80nm SON (Silicon-on-Nothing) MOSFETs with Perfect Morphology and High Electrical Performance, IEDM Technical Digest, 2001, pp. 645-648.
Monfray et al, Localized SOI Technology: An Innovative Low Cost Self-Aligned Process for Ultra Thin Si-film on thin BOX Integration for Low Power Applications, IEDM Technical Digest, 2007, pp. 693-696.

* cited by examiner

*Primary Examiner* — Tu-Tu Ho
(74) *Attorney, Agent, or Firm* — Turocy & Watson, LLP

(57) ABSTRACT

Multi-gate metal oxide silicon transistors and methods of making multi-gate metal oxide silicon transistors are provided. The multi-gate metal oxide silicon transistor contains a bulk silicon substrate containing one or more convex portions between shallow trench regions; one or more dielectric portions over the convex portions; one or more silicon fins over the dielectric portions; a shallow trench isolation layer in the shallow trench isolation regions; and a gate electrode. The upper surface of the shallow trench isolation layer can be located below the upper surface of the convex portion, or the upper surface of the shallow trench isolation layer can be located between the lower surface and the upper surface of first dielectric layer. The multi-gate metal oxide silicon transistor can contain second spacers adjacent to side surfaces of the convex portions in a source/drain region.

20 Claims, 28 Drawing Sheets

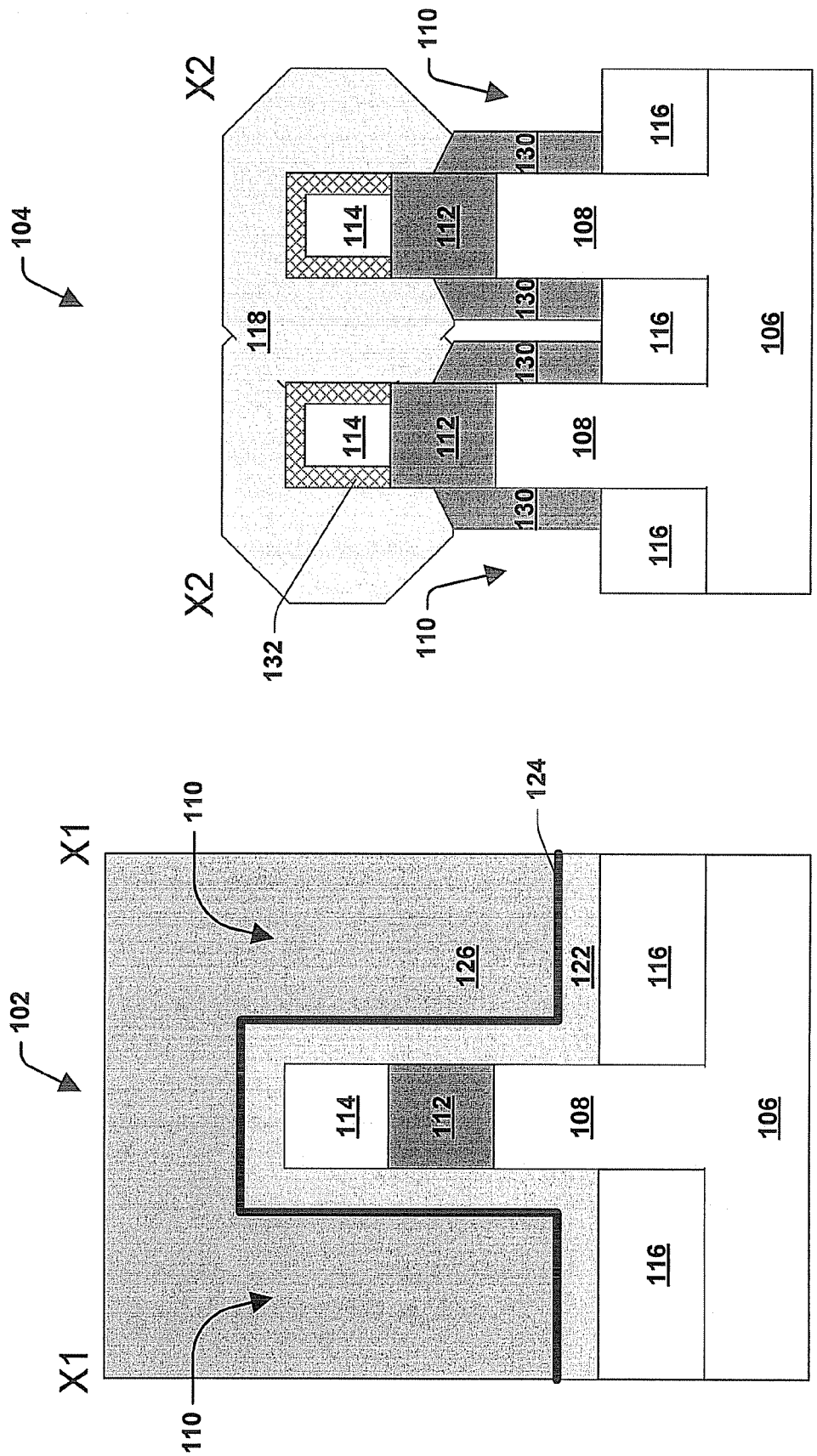

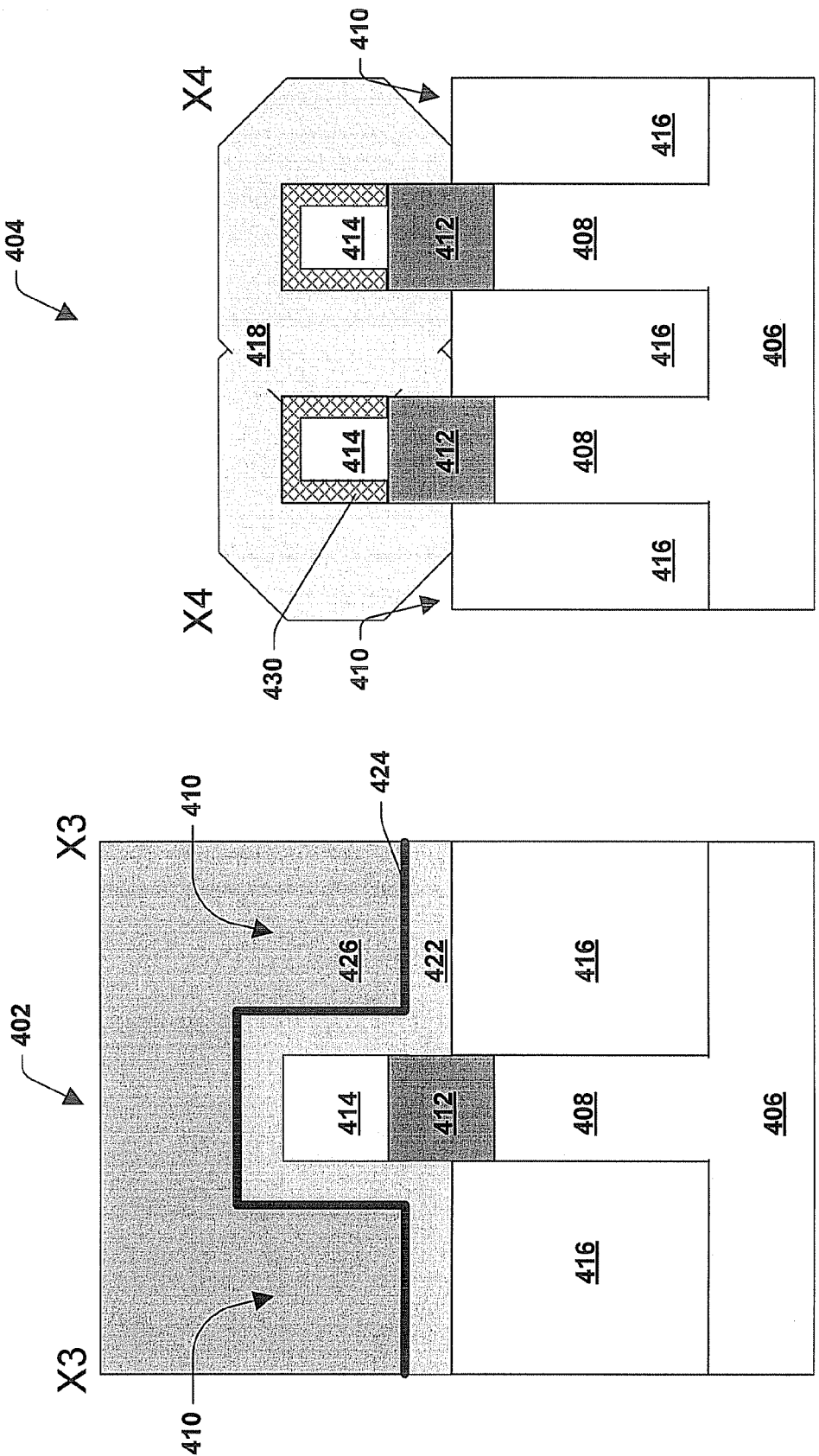

US 8,134,209 B2

SEMICONDUCTOR DEVICE AND METHOD FOR MANUFACTURING THE SAME

TECHNICAL FIELD

The following description relates generally to multi-gate metal oxide silicon transistors and methods of making multi-gate metal oxide silicon transistors.

BACKGROUND

As transistor design is improved and evolved, the number of different types of transistors continues to increase. Multi-gate non-planar metal oxide semiconductor field effect transistors (MOSFETs), including double-gate non-planar MOSFETs (e.g., finMOSFETs) and tri-gate non-planar MOSFETs, are developed to provide scaled devices with faster drive currents and reduced short channel effects over planar MOSFETs. Static random access memory (SRAM) cells can employ such multi-gate non-planar MOSFETs.

Double-gate non-planar MOSFETs are FETs in which a channel region is formed in a thin silicon fin. Source and drain regions are formed in the opposing ends of the fin on either side of the channel region. Gates are formed over the thin silicon fin in areas corresponding to channel regions. Fin-MOSFETs are a type of double-gate non-planar FETs in which the fin is so thin as to be fully depleted.

Tri-gate non-planar MOSFETs have a similar structure to that of double-gate non-planar MOSFETs; however, the fin width and height are approximately the same so that gates can be formed on three sides of the channel, including the top surface and the opposing sidewalls. The height to width ratio is generally in the range of 3:2 to 2:3 so that the channel will remain fully depleted and the three-dimensional field effects of a tri-gate MOSFET will give greater drive current and improved short-channel characteristics over a planar transistor.

SUMMARY

The following presents a simplified summary of the information disclosed in the specification in order to provide a basic understanding of some aspects of the disclosed information. This summary is not an extensive overview of the disclosed information, and is intended to neither identify key or critical elements of the disclosed information nor delineate the scope of the disclosed information. Its sole purpose is to present some concepts of the disclosed information in a simplified form as a prelude to the more detailed description that is presented later.

One aspect of the innovation provides multi-gate metal oxide silicon transistors. The multi-gate metal oxide silicon transistor contains a bulk silicon substrate containing one or more convex portions between shallow trench regions; one or more dielectric portions over the convex portions; one or more silicon fins over the dielectric portions; a shallow trench isolation layer in the shallow trench isolation regions; and a gate electrode. The upper surface of the shallow trench isolation layer can be located below the upper surface of the convex portion, or the upper surface of the shallow trench isolation layer can be located between the lower surface and the upper surface of first dielectric layer. The multi-gate metal oxide silicon transistor can further contain second spacers adjacent to side surfaces of the convex portions in a source/drain region.

Another aspect of the innovation provides methods of making a multi-gate metal oxide silicon transistor. The method can involve forming a silicon germanium layer over a bulk silicon substrate, and forming a silicon layer over the silicon germanium layer; forming shallow trench isolation regions, thereby forming, between the shallow trench isolation regions, one or more convex portions of the bulk silicon substrate, one or more silicon germanium portions over the convex portions, and one or more silicon fins over the silicon germanium portions; forming a shallow trench isolation layer in the shallow trench isolation regions; forming a first gate electrode containing a first high-k portion over the silicon fins, a first metal portion over the first high-k portion, and a first polysilicon portion over the first metal portion; forming first spacers adjacent to the side surfaces of the first gate electrode; and replacing the silicon germanium portions with dielectric portions. The upper surface of the shallow trench isolation layer can be located below the upper surface of the convex portion, or the upper surface of the shallow trench isolation layer can be located between the lower surface and the upper surface of the silicon germanium portion. The method can further involve forming second spacers adjacent to the side surfaces of the convex portions.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the disclosed information when considered in conjunction with the drawings.

BRIEF DESCRIPTION OF THE DRAWINGS

FIG. 2A is a cross sectional view of a portion of gate electrode region of an exemplary multi-gate metal oxide silicon transistor, such as that taken along line X1-X1 of FIG. 1 in accordance with an aspect of the subject innovation.

FIG. 2B is a cross sectional view of a portion of source/drain region of an exemplary multi-gate metal oxide silicon transistor, such as that taken along line X2-X2 of FIG. 1 in accordance with an aspect of the subject innovation.

FIG. 5A is a cross sectional view of a portion of gate electrode region of an exemplary multi-gate metal oxide silicon transistor, such as that taken along line X3-X3 of FIG. 4 in accordance with an aspect of the subject innovation.

FIG. 5B is a cross sectional view of a portion of source/drain region of an exemplary multi-gate metal oxide silicon transistor, such as that taken along line X5-X5 of FIG. 4 in accordance with an aspect of the subject innovation.

DETAILED DESCRIPTION

Figure 1:
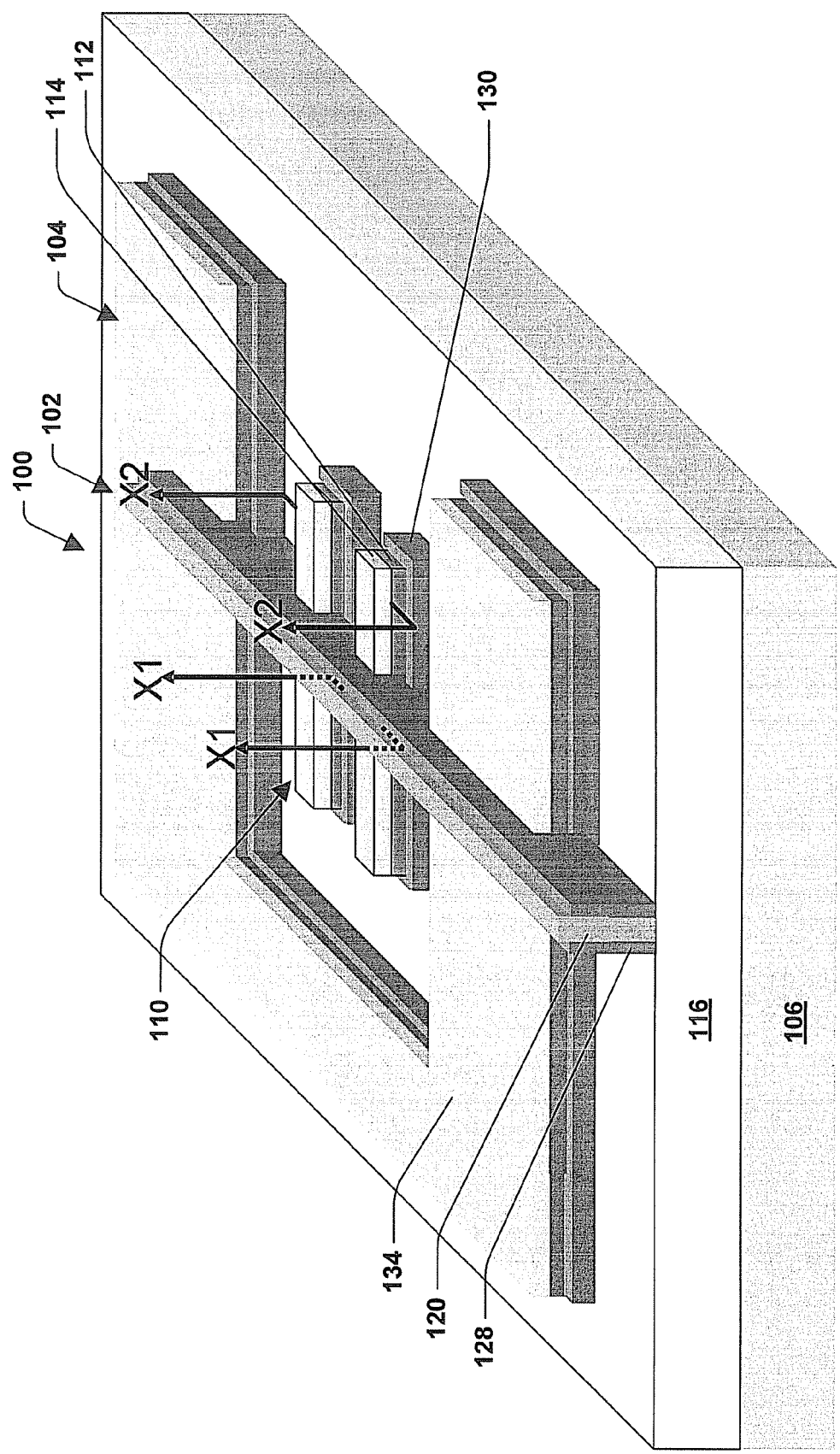
FIG. 1 is a top view of an exemplary multi-gate metal oxide silicon transistor in accordance with an aspect of the subject innovation.

The subject innovation described herein provides multi-gate metal oxide silicon transistors and methods of making multi-gate metal oxide silicon transistors. In particular, the subject innovation provides double-gate finFET, tri-gate finFET, or the like. In more particular, the subject innovation can provide silicon-on-nothing (SON) double-gate fin FET or SON tri-gate finFET. In the SON technology, an air gap (e.g., an opening) is formed below a channel region, and then a gate insulator is formed in the gap.

A conventional bulk finFET manufacturing process typically involves a high-density ion implantation to prevent punch-through leakage of the transistor. The impurity ions, however, may diffuse into a channel region, and therefore, may cause Vt variation. In a conventional bulk finFET manufacturing process, a height of a fin is generally defined by etch back of a shallow trench isolation via reactive ion etching (RIE). The RIE may cause variation in the fin height.

The subject multi-gate metal oxide silicon transistor can provide one or more of the following advantages: 1) the multi-gate metal oxide silicon transistor can provide substantially uniform device characteristics because the multi-gate metal oxide silicon transistor does not require punch-through ion implantation; 2) fin heights of the multi-gate metal oxide silicon transistor can be substantially uniform because the fin height is defined by a thickness of a layer formed via a epitaxial process, not via a RIE process; 3) the multi-gate metal oxide silicon transistor can be fabricated by using a low cost bulk silicon substrate; and/or 4) the multi-gate metal oxide silicon transistor can prevent and/or mitigate short circuits between the fin and silicon substrate because side surfaces of convex portions of a bulk silicon substrate are covered with a dielectric layer.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

FIG. 1 illustrates a top view of an exemplary multi-gate metal oxide silicon transistor. FIG. 2A illustrates a cross sectional view of a portion of gate electrode region of the field effect transistor 100, such as that taken along line X1-X1 in a gate electrode region 102 of FIG. 1. FIG. 2B illustrates a cross sectional view of a portion of source/drain region of the field effect transistor 100, such as that taken along line X2-X2 in a source/drain region 104 of FIG. 1.

The multi-gate metal oxide silicon transistor 100 can contain a bulk semiconductor substrate (e.g., bulk silicon substrate) 106 containing one or more convex portions 108 between shallow trench regions 110; one or more dielectric portions 112 over the convex portions; one or more silicon fins 114 over the dielectric portions; a shallow trench isolation layer 116 in the shallow trench isolation regions; a laterally grown silicon portion 118 that can decrease source and drain (S/D) resistance and/or electrically connect the silicon fins in the source/drain region when the transistor contains two or more silicon fins; a gate electrode 120; first spacers 128 adjacent to the side surfaces of the gate electrode; and second spacers 130 adjacent to side surfaces of the convex portions in the source/drain region. Source/drain portions (e.g., diffusion portion or layer) can be formed in the silicon fins (e.g., the upper surface and side surfaces of the silicon fins 132) and/or in the source/drain region. Two convex portions, two dielectric portions, and two silicon fins are illustrated in the disclosure and the drawings including FIGS. 1 and 2B for brevity's sake. The subject multi-gate metal oxide silicon transistor, however, can contain one or more convex portions, one or more dielectric portions, and one or more silicon fins. The multi-gate metal oxide silicon transistor 100 may be referred to a tri-gate finFET.

One or more neighboring transistors 134 can be optionally disposed on the bulk silicon substrate. In this example, one neighboring transistor 134 is disposed adjacent to the multi-gate metal oxide silicon transistor 100. The convex portions of the bulk silicon substrate and portions of the dielectric portion are covered with the second spacers, and not seen in FIG. 1. The upper portions of side surface of dielectric portion can be seen in FIG. 1. Further, the laterally grown silicon portion is omitted in FIG. 1 to illustrate the silicon fins 114 below the laterally grown silicon portion.

As illustrated in FIG. 2A, in the gate electrode region 102, the multi-gate metal oxide silicon transistor contains a gate electrode 120 over the silicon fin 114. The gate electrode 120 is provided over the silicon fin via a gate dielectric layer. The gate electrode 120 can contain suitable gate electrode materials, for example, a high-k portion 122 over the silicon fin, a metal portion 124 over the high-k portion, and a polysilicon portion 126 over the metal portion. The high-k portion 122 can be formed over the upper surface of the shallow trench isolation layer 116, the side surfaces of the dielectric portions 112, and the upper and side surfaces of the silicon fins 114. The metal portion 124 can be formed over the high-k portion and a polysilicon portion 126 over the metal portion. In one embodiment, the gate electrode is formed over portions of the convex portions 108 of the bulk silicon substrate.

As illustrated in FIG. 2B, in the source/drain region 104, the multi-gate metal oxide silicon transistor contains a laterally grown silicon portion 118 that can decrease source and drain (S/D) resistance and/or electrically connect the silicon fins when two or more silicon fins are contained. The multi-gate metal oxide silicon transistor further contains second spacers 130 adjacent to side surfaces of convex portions 108. The multi-gate metal oxide silicon transistor can contain source/drain portions at the silicon fin 114 including the two side surfaces and the upper surface of the silicon fins 132 and at the laterally grown silicon portion 118 in the source/drain region. The source/drain portions include one or more p-type dopants (e.g., boron) or n-type dopants (e.g., arsenic).

The multi-gate metal oxide silicon transistor contains one or more silicon fins 114 formed substantially vertically to the surface of the bulk silicon substrate in a direction substantially parallel to the surface of the bulk silicon substrate. In such a transistor, a current is induced to flow through side faces of the silicon fin in the direction substantially parallel to the surface of the bulk silicon substrate. The silicon fin may be referred to as a fin.

The transistor of the subject innovation can be a double-gate type transistor. The double-gate transistor generally contains a relatively narrow silicon fin formed substantially vertically to the surface of the bulk silicon substrate in a direction substantially parallel to the surface of the bulk silicon substrate. Channels are formed in two side surfaces of the silicon fin, and a current is induced to flow through the two or more surfaces.

The transistor of the subject innovation can be a tri-gate type transistor. The tri-gate transistor generally contains a relatively wide silicon fin formed substantially vertically to the surface of the bulk silicon substrate in a direction substantially parallel to the surface of the bulk silicon substrate. Channels are formed in three surfaces of side surfaces and an upper surface of the silicon fin, and a current is induced to flow through the three surfaces.

The one or more convex portions 108 of the bulk silicon substrate are formed substantially vertically to the surface of the bulk silicon substrate in a direction substantially parallel to the surface of the bulk silicon substrate. The convex portions can be formed by removing portions of the bulk semiconductor at the shallow trench isolation regions.

The one or more dielectric portions 112 are formed over the one or more convex portions of the bulk semiconductor. The dielectric portion can contain a suitable dielectric material. The dielectric portions can contain one or more different dielectric materials. In one embodiment, the dielectric portion contains three separate portions: a first silicon oxide portion, a silicon nitride portion, and a second silicon oxide portion. The oxide-nitride-oxide configuration may be referred to as an ONO portion.

The silicon fins 114 are formed over the dielectric portions. The silicon fin can be formed by an epitaxial growth process. Since the silicon fin can be formed by an epitaxial growth process, height variations among silicon fins can be minimized.

The shallow trench isolation layer 116 is formed in the shallow trench isolation regions 110. The upper surface of the shallow trench isolation layer 116 is located below the upper surface of the convex portion 108. The shallow trench isolation surrounds only a lower portion of the convex portion, and the shallow trench isolation dose not surrounds the whole portion of the convex portion. The shallow trench isolation layer 116 can contain a suitable dielectric material. Examples of shallow trench isolation layer materials include oxides such as silicon oxides (e.g., silicon oxide ($Si_xO_y$) and silicon dioxide ($SiO_2$)); nitrides such as silicon nitrides (e.g., silicon nitride ($Si_xN_y$), silicon rich nitride, and oxygen rich silicon nitride).

The laterally grown silicon portion 118 is on a side surface of the silicon fin 114 in the source/drain region 104. The laterally grown silicon portion 118 is protruded laterally from the silicon fin. The laterally grown silicon portion 118 can decrease S/D resistance and/or electrically connect the silicon fins in the source/drain region. The laterally grown silicon portion 118 does not electrically connect the two or more silicon fins in the gate electrode region. The laterally grown silicon portion 118 typically contains silicon and can be formed by a silicon epitaxial process. The laterally grown silicon portion 118 can be formed by growing a silicon epitaxial layer at least laterally on the side surface of the silicon fin 114.

The high-k portion 122 of the gate electrode can contain a suitable high-k material, for example, a metal oxide, such as hafnium oxide ($HfO_2$), hafnium silicate (HfSiO), aluminum oxide ($Al_2O_3$), tantalum oxide ($Ta_2O_5$), titanium oxide ($TiO_2$), zirconium oxide ($ZrO_2$), hafnium oxide ($HfO_2$), yttrium oxide ($Y_2O_3$), silicon zirconium oxide ($SiZrO_4$), lanthanum oxide ($La_2O_5$), other corresponding silicates, or the like. The metal portion can contain a suitable metal material, for example, tungsten (W), aluminum (Al), copper (Cu), titanium nitride (TiN) and gold (Au), combinations thereof, and the like.

The first spacers 128 are formed adjacent to the side surfaces of the gate electrode 102. The first spacers 128 cover the side surfaces of the gate electrode 102 (e.g., side surfaces of high-k portion, metal portion, and polysilicon portion). The first spacers 128 can contain a suitable dielectric material. Examples of first spacer materials include oxides such as silicon oxides (e.g., silicon oxide ($Si_xO_y$) and silicon dioxide ($SiO_2$)); nitrides such as silicon nitrides (e.g., silicon nitride ($Si_xN_y$), silicon rich nitride, and oxygen rich silicon nitride). The metal portion 124 of the gate electrode is covered with the high-k portion, the polysilicon portion, and the first spacers. The side surfaces of the metal portion are covered with the first spacers.

In this example, the second spacers 130 are formed adjacent to side surfaces of the dielectric portions and the convex portions 108 in the source/drain region. The second spacers 128 cover lower portions of side surfaces of dielectric portions 112 and the side surfaces of the convex portions 108. The second spacers 128 can contain a suitable dielectric material. Examples of second spacer materials include oxides such as silicon oxides (e.g., silicon oxide ($Si_xO_y$) and silicon dioxide ($SiO_2$)); nitrides such as silicon nitrides (e.g., silicon nitride ($Si_xN_y$), silicon rich nitride, and oxygen rich silicon nitride).

In FIG. 2B, the second spacer 130 is not in contact with an adjacent second spacer 130 and a space (gap) is provided between the second spacers 130. However, a part of the second spacers 130 may be in contact with each other.

The laterally grown silicon portion 118 is not in contact with the convex portion 108 or the semiconductor substrate 106. So, the source/drain region 104 is not electrically connected to the convex portion 108 or the semiconductor substrate 106. In other words, the laterally grown silicon portion 118 is isolated from the convex portion 108 by the second spacer 130.

The lower portion of the laterally grown silicon portion 118 is in contact with the second spacers 130.

Although not shown in FIGS. 1, 2A, and 2B, metal silicides can be formed over the laterally grown silicon portion, gate electrode, or combinations thereof. The metal silicides can contain refractory metals, such as tungsten, tantalum, molybdenum and the like; and metals of Group VIII of the Periodic Table, such as platinum, palladium, cobalt, nickel, and the like.

Figure 3B:
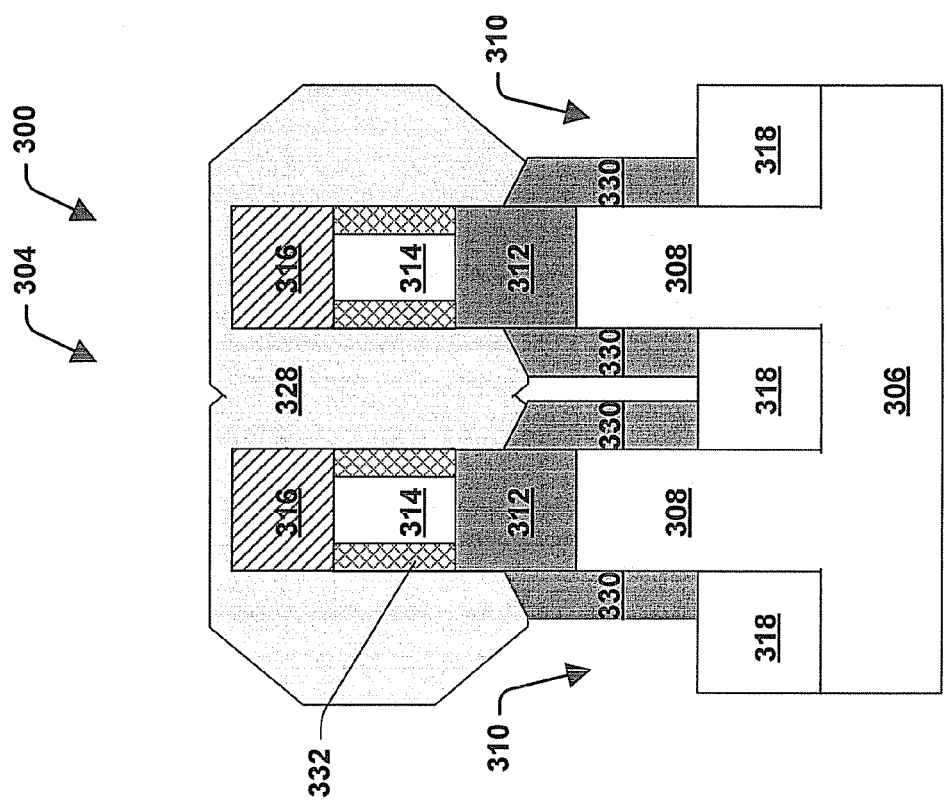
FIG. 3B is a cross sectional view of a portion of source/drain region of another exemplary multi-gate metal oxide silicon transistor in accordance with an aspect of the subject innovation.
Figure 3A:
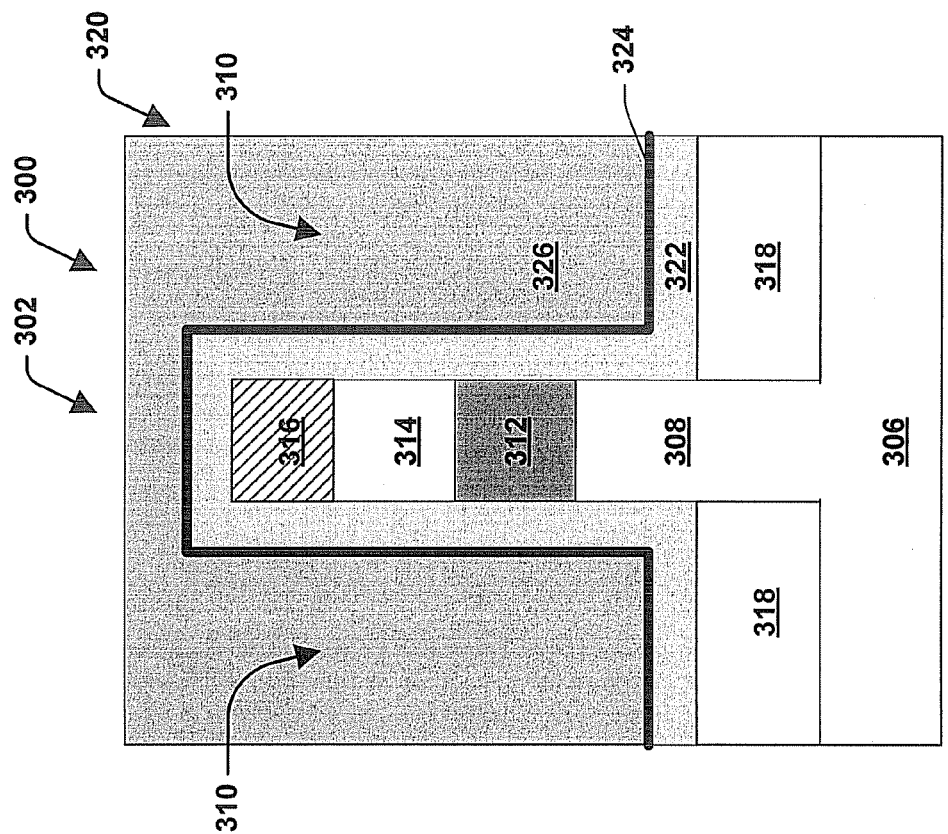
FIG. 3A is a cross sectional view of a portion of gate electrode region of another exemplary multi-gate metal oxide silicon transistor in accordance with an aspect of the subject innovation.

FIGS. 3A and 3B illustrate another exemplary multi-gate metal oxide silicon transistor 300. FIG. 3A illustrates a cross sectional view of a portion of gate electrode region 302 of the transistor 300. FIG. 3B illustrates a cross sectional view of a portion of source/drain region 304 of the transistor 300. The multi-gate metal oxide silicon transistor contains a bulk silicon substrate 306 containing convex portions 308 between shallow trench regions 310; dielectric portions 312 over the convex portions; silicon fins 314 over the dielectric portions; mask portions 316 over the silicon fins; and a shallow trench isolation layer 318 in the shallow trench isolation regions. The mask portions 316 are portions of a mask layer that is used as an etch mask when forming the shallow trench isolations. The mask portions can contain a suitable dielectric material. Examples of mask portion materials include oxides such as silicon oxides (e.g., silicon oxide ($Si_xO_y$) and silicon dioxide ($SiO_2$)); nitrides such as silicon nitrides (e.g., silicon nitride ($Si_xN_y$), silicon rich nitride, and oxygen rich silicon nitride). In one embodiment, the mask portion contains silicon nitrides. The multi-gate metal oxide silicon transistor 300 may be referred to a double-gate finFET.

As illustrated in FIG. 3A, in the gate electrode region 302, the multi-gate metal oxide silicon transistor contains a gate electrode 320 over the mask portions. The gate electrode 302 is provided over the silicon fin via a gate dielectric layer. The gate electrode 302 can contain suitable gate electrode materials, for example, a high-k portion 322 over the silicon fin, a metal portion 324 over the high-k portion, and a polysilicon portion 326 over the metal portion. The high-k portion 322 can be formed over the upper surface of the shallow trench isolation layer 318, the side surfaces of a portion of the convex portions 308, the side surfaces of the dielectric portions 312, and the side surfaces of the silicon fins 314, and the upper surface and side surfaces of the mask portions 316. The metal portion 324 can be formed over the high-k portion, and a polysilicon portion 326 over the metal portion. In one embodiment, the gate electrode is formed over portions of the convex portions 308 of the bulk silicon substrate.

As illustrated in FIG. 3B, in the source/drain region 304, the multi-gate metal oxide silicon transistor contains a laterally grown silicon portion 328 that can decrease S/D resistance and/or electrically connect the silicon fins 314. The multi-gate metal oxide silicon transistor further contains second spacers 330 adjacent to side surfaces of the silicon fins 314 and the side surfaces of convex portions 308. The multi-gate metal oxide silicon transistor can contain source/drain portions at the silicon fin 314 including the two side surfaces 332 of the silicon fins and at the laterally grown silicon portion 328 in the source/drain region.

Figure 4:
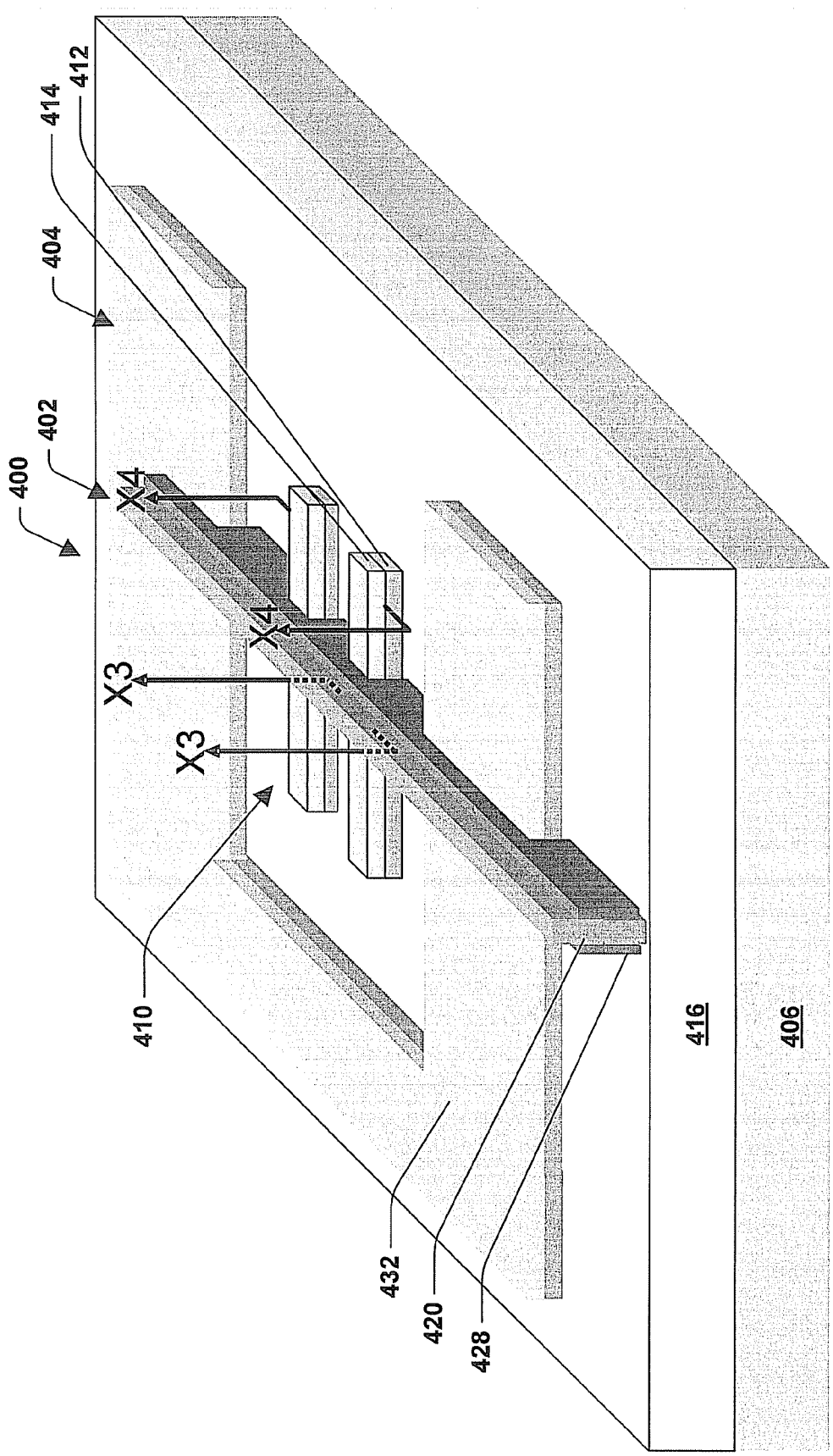
FIG. 4 is a top view of another exemplary multi-gate metal oxide silicon transistor in accordance with an aspect of the subject innovation.

FIG. 4 illustrates a top view of another exemplary multi-gate metal oxide silicon transistor 400. FIG. 5A illustrates a cross sectional view of a portion of gate electrode region 402 of the field effect transistor 400, such as that taken along line X3-X3 of FIG. 4. FIG. 5B illustrates a cross sectional view of a portion of source/drain region 404 of the field effect transistor 400, such as that taken along line X4-X4 of FIG. 4.

The multi-gate metal oxide silicon transistor 400 can contains a bulk silicon substrate 406 containing one or more convex portions 408 between shallow trench regions 410; one or more dielectric portions 412 over the convex portions; one or more silicon fins 414 over the dielectric portions; a shallow trench isolation layer 416 in the shallow trench isolation regions; a laterally grown silicon portion 418 that can decrease source and drain (S/D) resistance and/or electrically connect the silicon fins in the source/drain region; a gate electrode 420; first spacers 428 adjacent to the side surfaces of the gate electrode. The upper surface of the shallow trench isolation layer is located between the upper surface of the dielectric portion and the lower surface of the dielectric portion. The multi-gate metal oxide silicon transistor contains source/drain portions at the silicon fin 414 including the upper surface and side surfaces 430 of the silicon fins and at the laterally grown silicon portion 418 in the source/drain region. Although two convex portions, two dielectric portions, and two silicon fins are illustrated in FIGS. 4 and 5B, the subject multi-gate metal oxide silicon transistor 400 can contain one or more convex portions, one or more dielectric portions, and one or more silicon fins. The multi-gate metal oxide silicon transistor 400 may be referred to a tri-gate finFET.

The lower portions of the dielectric portions 412 and the convex portions 408 of the bulk silicon substrate and are covered with the shallow trench isolation layer 416. The laterally grown silicon portion 418 is omitted in FIG. 4 to illustrate the silicon fins 414 below the laterally grown silicon portion. One or more neighboring transistors 432 can be disposed on the bulk silicon substrate.

As illustrated in FIG. 5A, in the gate electrode region 402, the multi-gate metal oxide silicon transistor contains a gate electrode 420 over the silicon fins 414. The gate electrode 402 is provided over the silicon fin 414 via a gate dielectric layer. The gate electrode 402 can contain suitable gate electrode materials, for example, a high-k portion 422 over the silicon fins, a metal portion 424 over the high-k portion, and a polysilicon portion 426 on the metal portion. The high-k portion 422 can be formed over the upper surface of the shallow trench isolation layer 416, the side surfaces of the dielectric portions 412, and the upper surface and the side surfaces of the silicon fins 414. The metal portion 424 can be formed over the high-k portion 422, and a polysilicon portion 426 over the metal portion 424. In one embodiment, the gate electrode is formed over portions of the convex portions 408 of the bulk silicon substrate.

As illustrated in FIG. 5B, in the source/drain region 404, the multi-gate metal oxide silicon transistor contains a laterally grown silicon portion 418 that can decrease S/D resistance and/or electrically connect the silicon fins. In this example, the multi-gate metal oxide silicon transistor does not contain dielectric spacers (spacers 130 as in FIG. 2B) adjacent to side surfaces of the silicon fins and the side surfaces of convex portions. Instead, the shallow trench isolation layer 416 covers lower portions of side surfaces of dielectric portions 412 and the side surfaces of the convex portions 408. The top surface of the shallow trench isolation layer 416 is provided below a boundary between the dielectric portions 412 and the convex portion 408. The multi-gate metal oxide silicon transistor can contain source/drain portions at the silicon fin 414 including the two side surfaces and the upper surface 430 of the silicon fins and at the laterally grown silicon portion 414 in the source/drain region.

The laterally grown silicon portion 414 is not electrically connected to the convex portion 408, since grown silicon from the side surface of the silicon fin 414 is physically blocked by the shallow trench isolation layer 416 and not grown downward further.

Figure 6B:
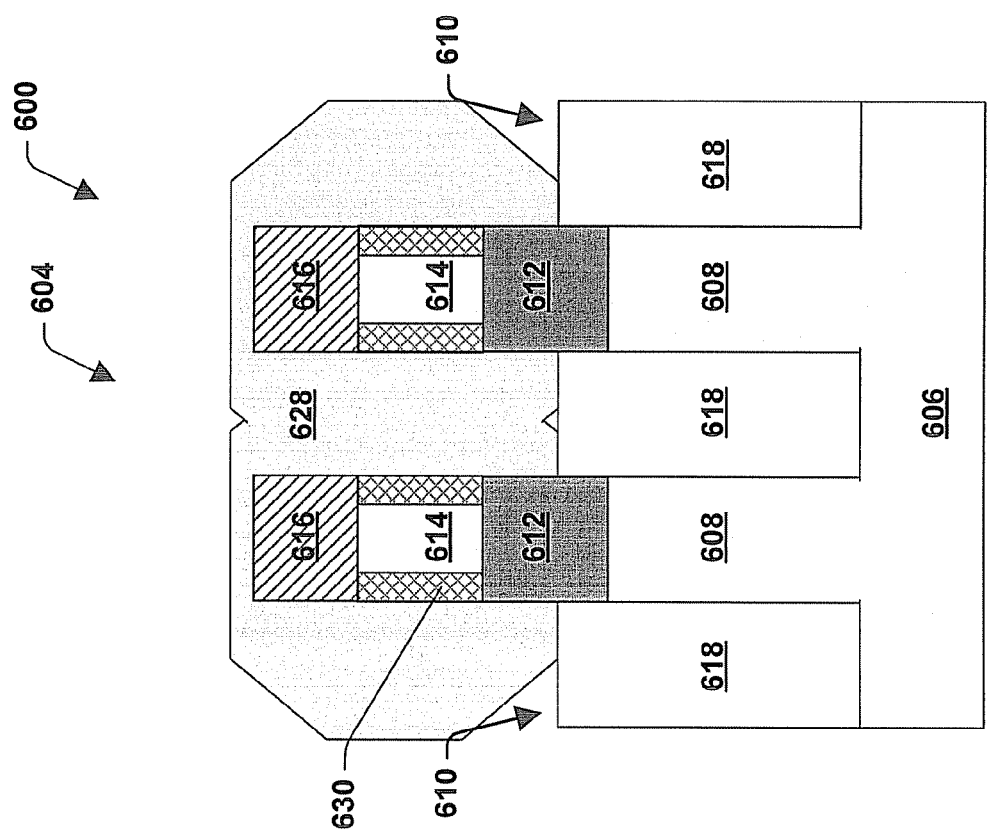
FIG. 6B is a cross sectional view of a portion of source/drain region of another exemplary multi-gate metal oxide silicon transistor in accordance with an aspect of the subject innovation.
Figure 6A:
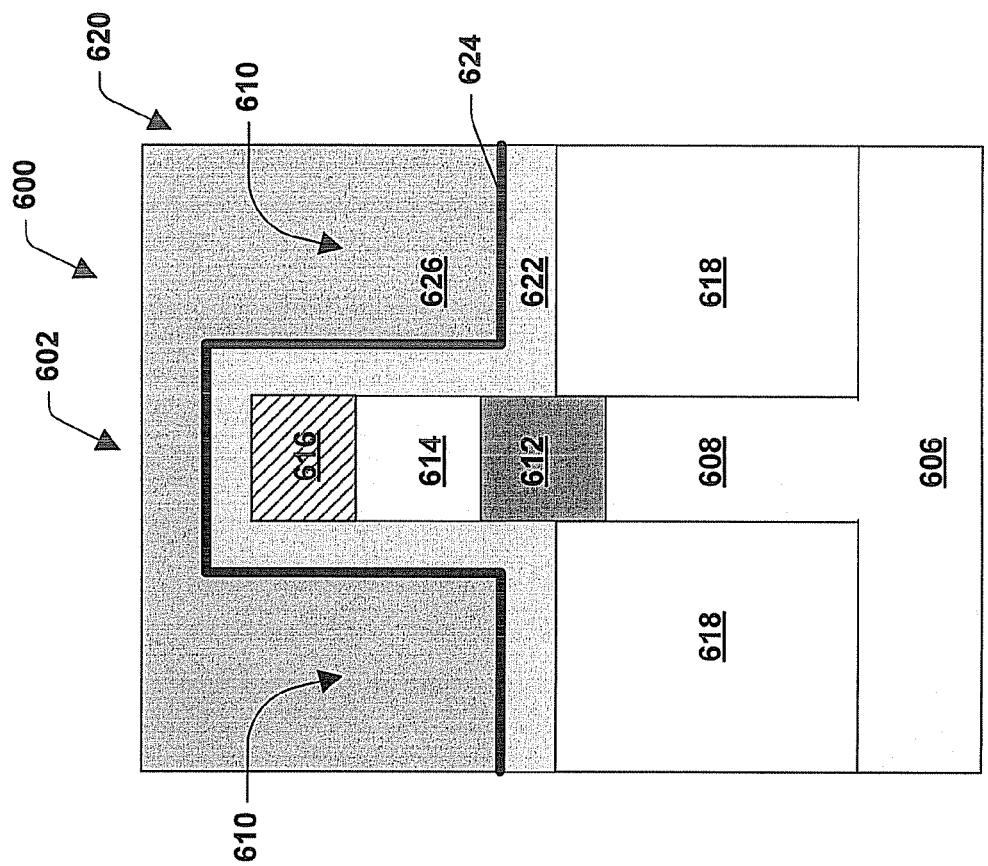
FIG. 6A is a cross sectional view of a portion of gate electrode region of another exemplary multi-gate metal oxide silicon transistor in accordance with an aspect of the subject innovation.

FIGS. 6A and 6B illustrate another exemplary multi-gate metal oxide silicon transistor 600. FIG. 6A illustrates a cross sectional view of a portion of gate electrode region 602 of the field effect transistor. FIG. 6B illustrates a cross sectional view of a portion of source/drain region 604 of the field effect transistor. The multi-gate metal oxide silicon transistor contains a bulk silicon substrate 606 containing one or more convex portions 608 between shallow trench regions 610; one or more dielectric portions 612 over the convex portions; one or more silicon fins 614 over the dielectric portions; one or more mask portions 616 over the silicon fins; and a shallow trench isolation layer 618 in the shallow trench isolation regions. The mask portions 616 are portions of a mask layer that is used as an etch mask when forming the shallow trench isolations. The mask portions 616 can contain the same material as the mask portion as described in connection with FIGS.

3A and 3B. Although two convex portions 608, two dielectric portions 612, and two silicon fins 614 are illustrated in FIG. 6B, the subject multi-gate metal oxide silicon transistor can contain one or more convex portions 608, one or more dielectric portions 612, and one or more silicon fins 614. The multi-gate metal oxide silicon transistor 600 may be referred to a double-gate finFET.

As illustrated in FIG. 6A, in the gate electrode region 602, the multi-gate metal oxide silicon transistor contains a gate electrode 620 over the mask portions. The gate electrode 602 is provided over the silicon fin 614 via a gate dielectric layer. The gate electrode 602 can contain suitable gate electrode materials, for example, a high-k portion 622, a metal portion 624 over the high-k portion 622, and a polysilicon portion 626, The high-k portion 622 can be formed over the upper surface of the shallow trench isolation layer 618, upper portions of the side surfaces of the dielectric portions 612, and the side surfaces of the silicon fins 614, and the upper and side surfaces of the mask portions 616. The metal portion 624 can be formed over the high-k portion 622, and the polysilicon portion 626 can be formed over the metal portion 624. In one embodiment, the gate electrode is formed over portions of the convex portions 608 of the bulk silicon substrate.

As illustrated in FIG. 6B, in the source/drain region 604, the multi-gate metal oxide silicon transistor contains a laterally grown silicon portion 628 that can decrease S/D resistance and/or electrically connect the silicon fins. In this example, the multi-gate metal oxide silicon transistor does not contain dielectric spacers adjacent to side surfaces of dielectric portions and the side surfaces of convex portions. Instead, the shallow trench isolation layer covers lower portions of side surfaces of dielectric portions and the side surfaces of the convex portions, thereby preventing and/or mitigating short circuits between the silicon fin and convex portion (e.g., bulk silicon substrate). The multi-gate metal oxide silicon transistor can contain source/drain portions at the silicon fins 614 including the two side surfaces of the silicon fins 630 and at the laterally grown silicon portion 628 in the source/drain region.

Figure 7:
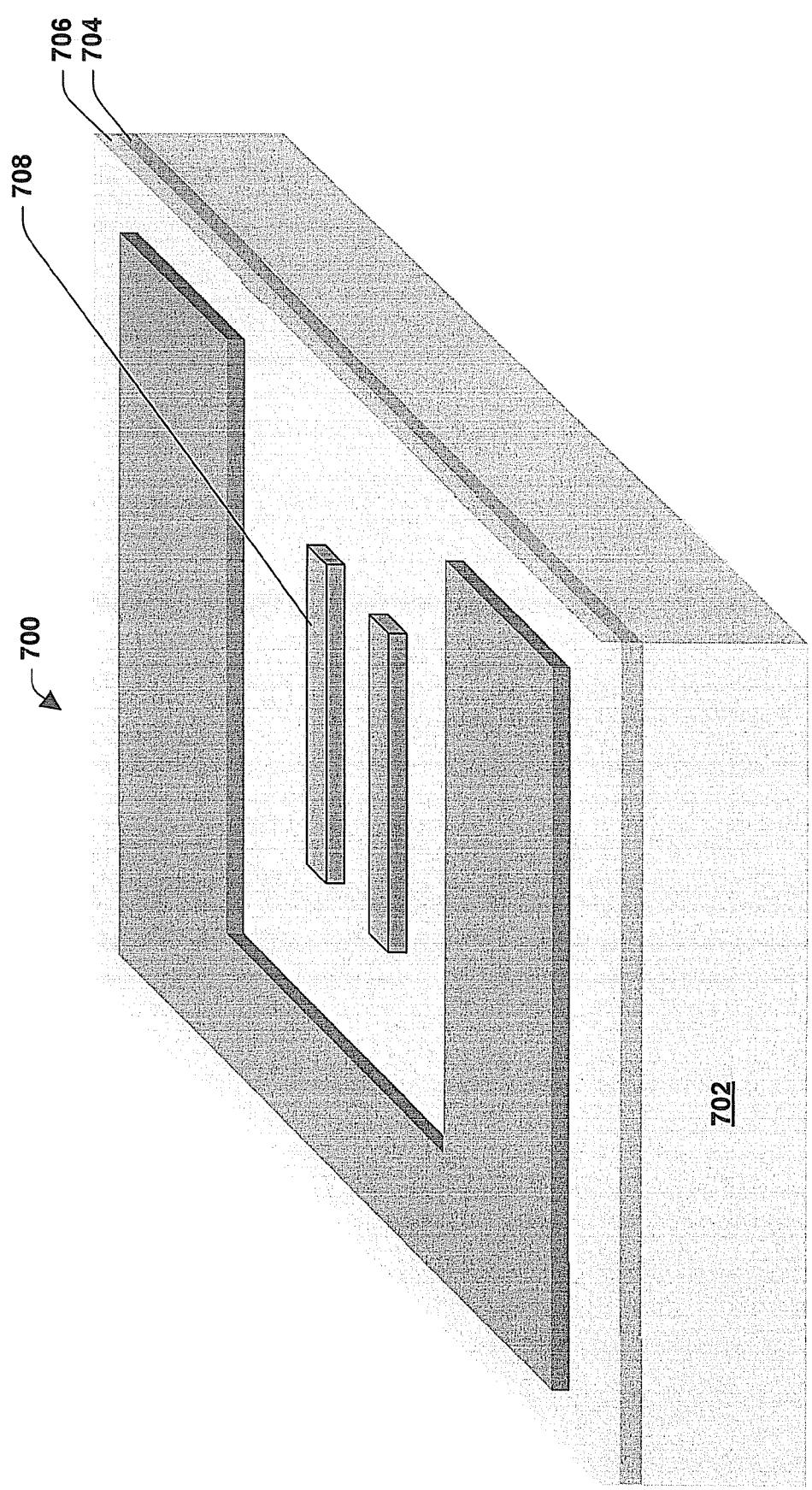
FIGS. 7-15 illustrate an exemplary methodology of forming a multi-gate metal oxide silicon transistor in accordance with an aspect of the subject innovation.

Referring to FIGS. 7 to 15, FIGS. 16 to 20, FIGS. 21 to 26, three of many possible exemplary embodiments of forming a multi-gate metal oxide silicon transistor are specifically illustrated. FIG. 7 illustrates a cross sectional view of an intermediate state of an exemplary multi-gate metal oxide silicon transistor 700. The intermediate transistor can contain a bulk silicon substrate 702, a silicon germanium layer 704 over the bulk semiconductor layer, a silicon layer 706, and a first patterned mask layer 708.

The silicon germanium layer 704 can be formed by epitaxial growth technique. The silicon germanium epitaxial growth can proceed under a suitable condition, for example, at elevated temperatures (e.g., 1,100 degrees Celsius) using a silicon source gas (e.g., SiH4, $Si_2H_6$, $SiH_8$, $SiF_4$, and the like), a germanium source gas (e.g., $GeH_4$, $GeF_4$, and the like), and optionally a carrier gas.

The silicon germanium layer 704 has a suitable amount of germanium. In one embodiment, the silicon germanium layer 704 contains about 5 wt. % or more and about 80 wt. % or less of silicon and about 20 wt. % or more and about 95 wt. % of germanium. In another embodiment, the silicon germanium layer 704 contains about 30 wt. % or more and about 75 wt. % or less of silicon and about 25 wt. % or more and about 70 wt. % of germanium. In yet another embodiment, the silicon germanium layer contains about 60 wt. % or more and about 70 wt. % or less of silicon and about 30 wt. % or more and about 40 wt. % of germanium.

The silicon germanium layer 704 has a suitable height that depends on the desired implementations of the multi-gate metal oxide silicon transistor structure being fabricated. The height may vary and are not critical to the subject innovation. In one embodiment, the height of the silicon germanium layer 704 is about 5 nm or more and about 80 nm or less. In another embodiment, the height of the silicon germanium layer is about 10 nm or more and about 70 nm or less. In yet another embodiment, the height of the silicon germanium layer 704 is about 15 nm or more and about 60 nm or less.

The silicon layer 706 can be formed by epitaxial growth technique. The silicon epitaxial growth can proceed under a suitable condition, for example, at elevated temperatures (e.g., 1,100 degrees Celsius) using a silicon source gas (e.g., SiH4, $Si_2H_6$, $SiH_8$, $SiF_4$, and the like) and optionally a carrier gas.

The silicon layer 706 has a suitable height that depends on the desired implementations of the multi-gate metal oxide silicon transistor structure being fabricated. The height may vary and are not critical to the subject innovation. In one embodiment, the height of the silicon layer is about 5 nm or more and about 80 nm or less. In another embodiment, the height of the silicon layer is about 10 nm or more and about 70 nm or less. In yet another embodiment, the height of the silicon layer is about 15 nm or more and about 60 nm or less.

The first patterned mask layer 708 can be formed by a suitable technique. For example, the first patterned mask layer is formed by optical lithography, sidewall image transfer technique, or the like. Although not shown in FIG. 7, when the first patterned mask layer is formed by the sidewall image transfer technique, the first patterned mask can be in the shape of a triangle, trapezoid, or the like. The mask layer typically contains nitrides such as silicon nitride, silicon rich nitride, and oxygen rich silicon nitride; or the like.

Figure 8:
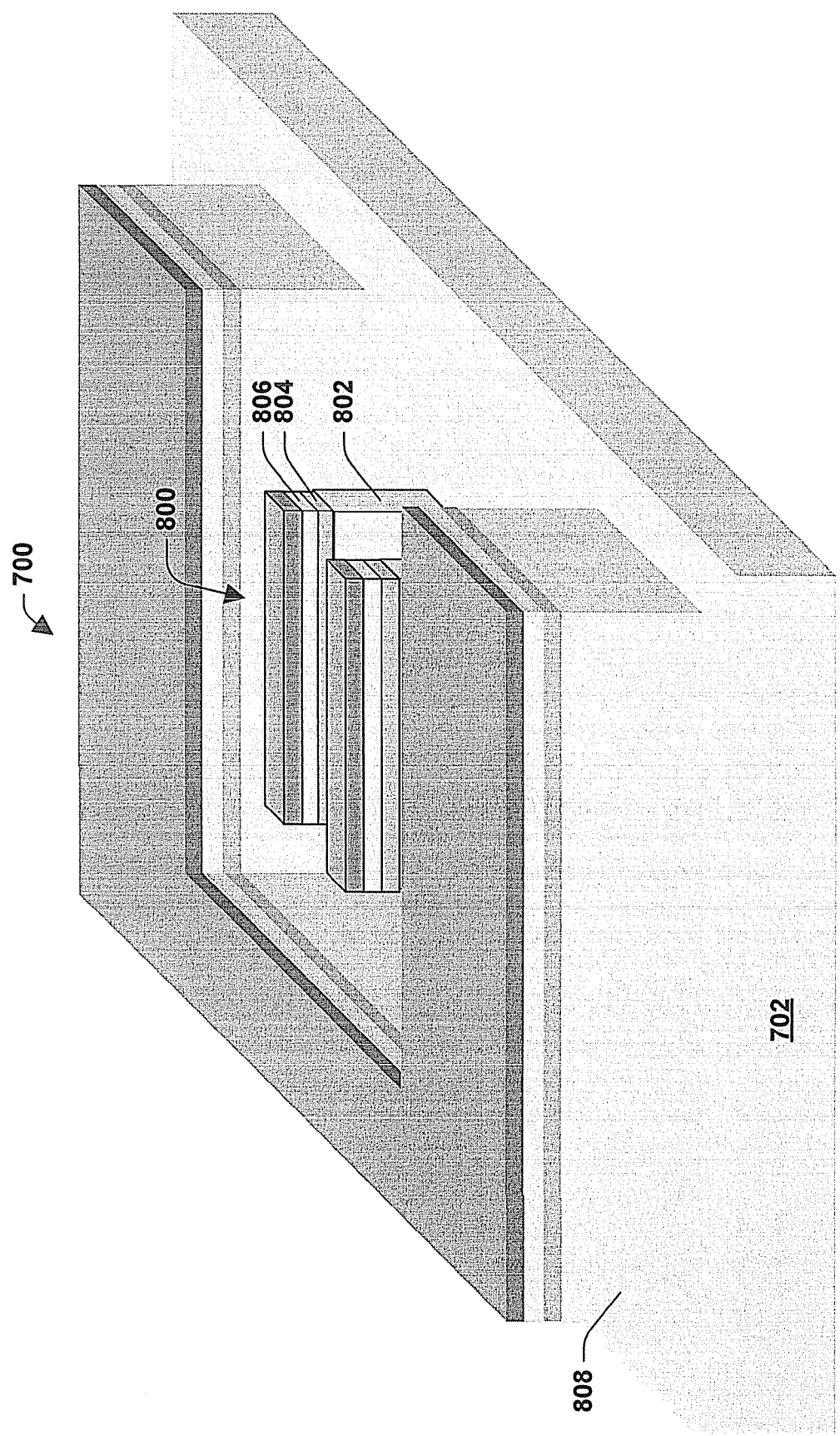

FIG. 8 illustrates forming shallow trench isolation regions 800, thereby forming, between the shallow trench isolation regions, two or more convex portions 802 of the bulk silicon substrate, two or more silicon germanium portions 804 over the convex portions, and two or more silicon fins 806 over the silicon germanium portions 804. Although two convex portions 802, two silicon germanium portions 804, and two silicon fins 806 are illustrated in FIG. 8, one or more convex portions 802, one or more silicon germanium portions 804, and one or more silicon fins 806 can be formed. The shallow trench isolation regions are formed at the top portion of the bulk silicon substrate by using a first patterned mask layer 708 and removing portions of bulk silicon substrate that are not covered by the first patterned mask layer.

The shallow trench isolation regions can be formed by a suitable etching technique. Examples of etching include reactive ion etching and anisotropic chemical wet. Examples of etchants of anisotropic chemical wet etching include base solutions such as tetraalkylammonium hydroxides (e.g., tetramethylammonium hydroxide (TMAH)) and ammonium hydroxide ($NH_4OH$). By way of example, forming a trench using a TMAH solution is described below. Forming the trench using the TMAH solution is typically administered by immersing the bulk silicon substrate into the TMAH solution or spraying/spreading the TMAH solution over the top of the bulk silicon substrate.

The TMAH solution may contain a sufficient amount of TMAH to facilitate removing portions of the bulk silicon substrate without substantially damaging or etching other components. In one embodiment, the TMAH solution contains about 0.5% of TMAH by weight or more and about 40% of TMAH by weight or less. The bulk silicon substrate is contacted with the TMAH solution at a suitable temperature for a suitable time to facilitate forming the trench. In one embodiment, the silicon substrate is contacted with the TMAH solution at a temperature of about 20 degrees Celsius or more and about 100 degrees Celsius or less for about 5 seconds or more and about 20 minutes or less.

In another embodiment, the etchant is a $NH_4OH$ solution. $NH_4OH$ may be diluted in water, such as de-ionized water, to produce the TMAH solution having a desired concentration of $NH_4OH$ (e.g., $NH_4OH:H_2O$=1:3,000 (wt/wt)). The silicon substrate is contacted with a $NH_4OH$ solution at a temperature of about 45 degrees Celsius, for about 100 seconds.

The shallow trench isolation region has a suitable depth (e.g., a distance from the bottom surface of the shallow trench isolation region to the upper surface of the silicon layer). The trench can have a substantially uniform depth. The depth may vary and may not be critical to the subject innovation. The depth may depend on the desired implementations of the field effect transistor being fabricated. In one embodiment, the depth of the trench is about 30 nm or more and about 200 nm or less. In another embodiment, the depth is about 40 nm or more and about 150 nm or less. In yet another embodiment, the depth is about 50 nm or more and about 100 nm or less. In still yet another embodiment, the depth is about 70 nm.

As a result of forming the shallow trench isolation regions, the one or more convex portions of the bulk silicon substrate, the one or more silicon germanium portions over the convex portions, and the one or more silicon fins over the silicon germanium portions are formed. The convex portions, the one or more silicon germanium portions, and the one or more silicon fins have a substantially rectangular parallelepiped shape. The dimensions of the upper and lower surfaces of the convex portions, the silicon germanium portions, and the silicon fins have a suitable length depending on the desired implementations of the field effect transistor being fabricated.

The heights of silicon germanium portion and silicon fin can be equivalent to the heights of the silicon germanium layer and silicon layer, respectively. In one embodiment, the height of the convex portion is about 20 nm or more and about 150 nm or less. In another embodiment, the height of the convex portion is about 30 nm or more and about 130 nm or less. In yet another embodiment, the height of the convex portion is about 40 nm or more and about 100 nm or less.

In one embodiment, the short sides of the upper and lower surfaces of the convex portions, the silicon germanium portions, and the silicon fins are about 5 nm or more and about 100 nm or less. In another embodiment, the short sides of the upper and lower surfaces of the convex portions, the silicon germanium portions, and the silicon fins are about 7 nm or more and about 70 nm or less. In yet another embodiment, the short sides of the upper and lower surfaces of the convex portions, the silicon germanium portions, and the silicon fins are about 10 nm or more and about 50 nm or less.

In one embodiment, the long sides of the upper and lower surfaces of the convex portions, the silicon germanium portions, and the silicon fins are about 300 nm or more and about 1,500 nm or less. In another embodiment, the long sides of the upper and lower surfaces of the convex portions, the silicon germanium portions, and the silicon fins are about 400 nm or more and about 1,300 nm or less. In yet another embodiment, the long sides of the upper and lower surfaces of the convex portions, the silicon germanium portions, and the silicon fins are about 500 nm or more and about 1,000 nm or less.

As a result of forming the shallow trench isolation regions, neighboring transistor portions 808 can be formed. Although FIG. 8 illustrates a neighboring transistor portion 808 in a U-shape, the neighboring transistor portions can have a suitable shape. In one embodiment, the neighboring transistor portions have a linear shape, I-shape, L-shape, T-shape, Y-shape, V-shape, or combinations thereof.

Figure 9:
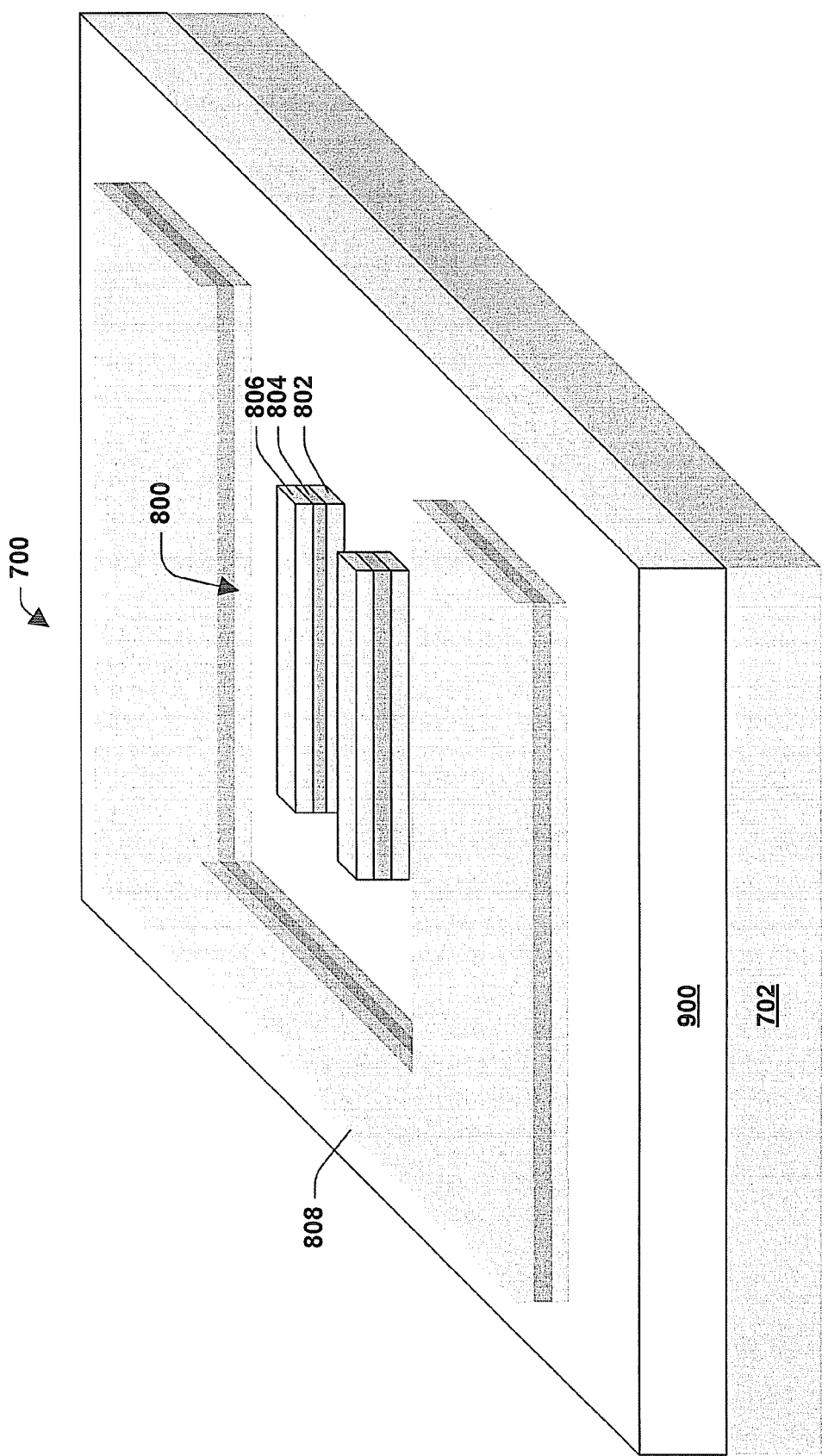

FIG. 9 illustrates forming a shallow trench isolation layer 900 in the shallow trench isolation regions 800. The shallow trench isolation layer 900 can be formed by depositing a material of shallow trench isolation layer over the bulk silicon substrate and removing the upper portion of the material via chemical-mechanical polishing (CMP) and/or etching (e.g., reactive ion (RI) etching). When the first patterned mask layer 708 exists on the upper surface of the silicon fins, an upper portion of the isolation material is polished by CMP down to the upper surface of the first patterned mask layer, and then an upper portion of the insulation layer is further removed by RI etching. The first patterned hard mask can be removed by suitable etching thereafter.

The shallow trench isolation layer 900 has a suitable height as long as the top of the shallow trench isolation layer 900 is lower than the top of the convex portion. The upper surface of the shallow trench isolation layer is located below the upper surface of the convex portion. In one embodiment, the height of the shallow trench isolation layer is about 5 nm or more and about 135 nm or less. In another embodiment, the height of the shallow trench isolation layer is about 10 nm or more and about 110 nm or less. In yet another embodiment, the height of the shallow trench isolation layer is about 10 nm or more and about 70 nm or less.

An upper portion of the convex portion 802 is not surrounded with the shallow trench isolation layer 900. The upper portion of the convex portion is protruded above the upper surface of the shallow trench isolation layer 900. In one embodiment, the height of the protruded convex portion is about 15 nm or more and about 140 nm or less. In another embodiment, the height of the protruded convex portion is about 20 nm or more and about 120 nm or less. In yet another embodiment, the height of the protruded convex portion is about 30 nm or more and about 90 nm or less.

Figure 10:
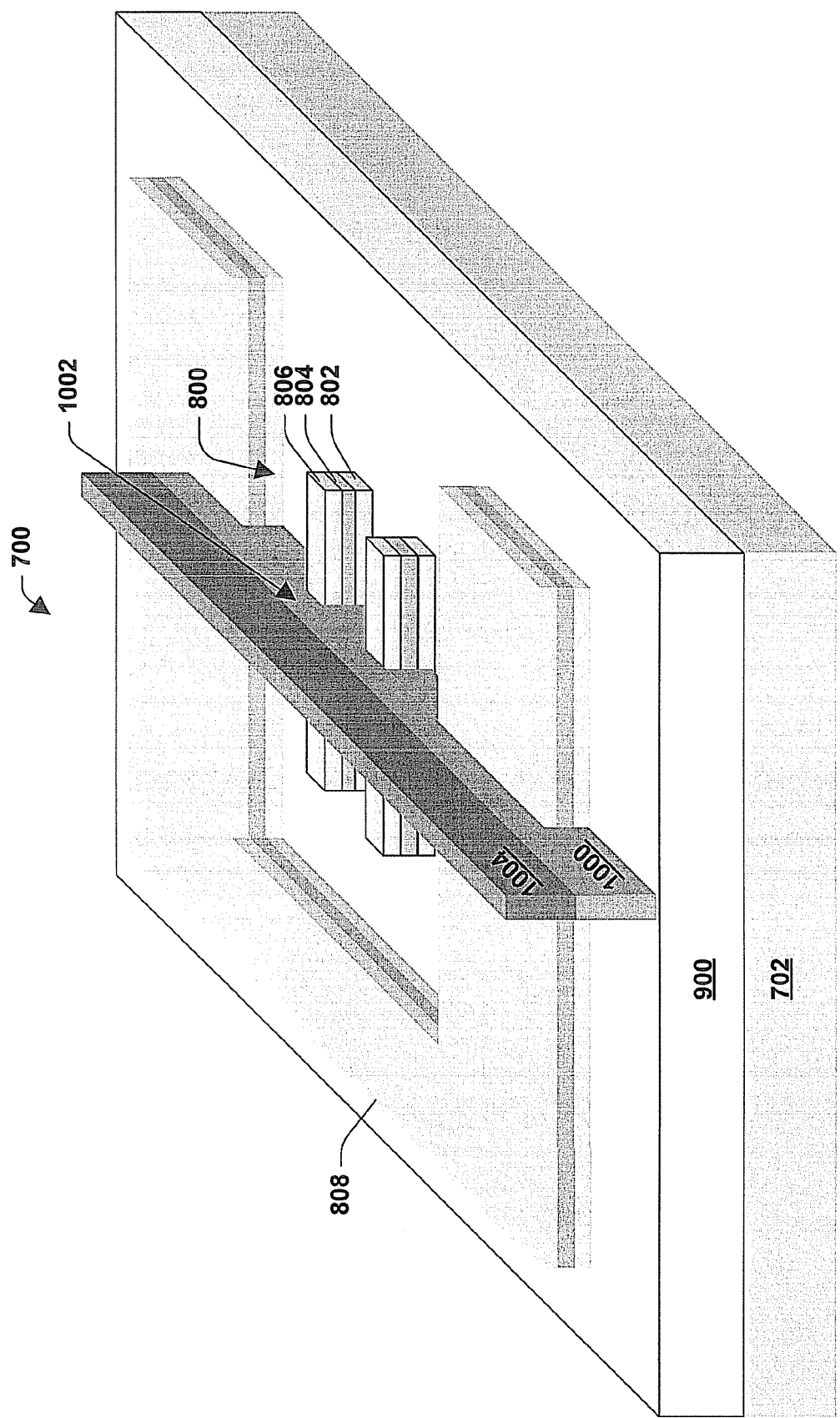

FIG. 10 illustrates forming a gate electrode 1000 over the silicon fins in a gate electrode region 1002. The gate electrode can be formed in a direction substantially perpendicular to the direction of long side of the silicon fin 804. The gate electrode can be formed at the middle of the long side of the silicon fin 804. The gate electrode can contain a high-k portion over the silicon fins, a metal portion over the high-k portion, and a polysilicon portion over the metal portion in the same manner as described in connection with FIG. 2.

The gate electrode can be formed by a suitable technique. For example, a high-k layer is formed over the bulk silicon substrate (e.g., silicon fins) by suitable techniques including CVD, a metal layer is formed over the high-k layer by suitable techniques including CVD and physical vapor deposition (PVD), and a polysilicon layer is formed over the high-k layer by deposition (e.g., CVD, spin-on techniques, and the like), and the high-k layer, the metal layer, and the polysilicon layer are patterned by lithography and etching techniques using a second patterned mask layer 1004.

The gate electrode has a suitable dimension depending on the desired implementations of the field effect transistor being fabricated. In one embodiment, the height of the gate electrode is about 50 nm or more and about 200 nm or less. In another embodiment, the height of the gate electrode is about 60 nm or more and about 180 nm or less. In yet another embodiment, the height of the gate electrode is about 70 nm or more and about 150 nm or less.

In one embodiment, the short side of the gate electrode are about 5 nm or more and about 50 nm or less. In another embodiment, the short side of the gate electrode are about 7 nm or more and about 45 nm or less. In yet another embodiment, the short side of the gate electrode are about 10 nm or more and about 40 nm or less. In one embodiment, the long side of the gate electrode are about 200 nm or more and about 1,500 nm or less. In another embodiment, the long side of the gate electrode are about 300 nm or more and about 1,300 nm or less. In yet another embodiment, the long side of the gate electrode are about 400 nm or more and about 1,200 nm or less.

In one embodiment, the height of the high-k portion is about 0.5 nm or more and about 20 nm or less. In another embodiment, the height of the high-k portion is about 0.7 nm or more and about 10 nm or less. In another embodiment, the height of the high-k portion is about 1 nm or more and about 8 nm or less. In one embodiment, the height of the metal portion is about 0.5 nm or more and about 20 nm or less. In another embodiment, the height of the metal portion is about 0.7 nm or more and about 10 nm or less. In yet another embodiment, the height of the metal portion is about 1 nm or more and about 8 nm or less. In one embodiment, the height of the polysilicon portion is about 30 nm or more and about 200 nm or less. In another embodiment, the height of the polysilicon portion is about 40 nm or more and about 180 nm or less. In yet another embodiment, the height of the polysilicon portion is about 50 nm or more and about 150 nm or less.

Figure 11:
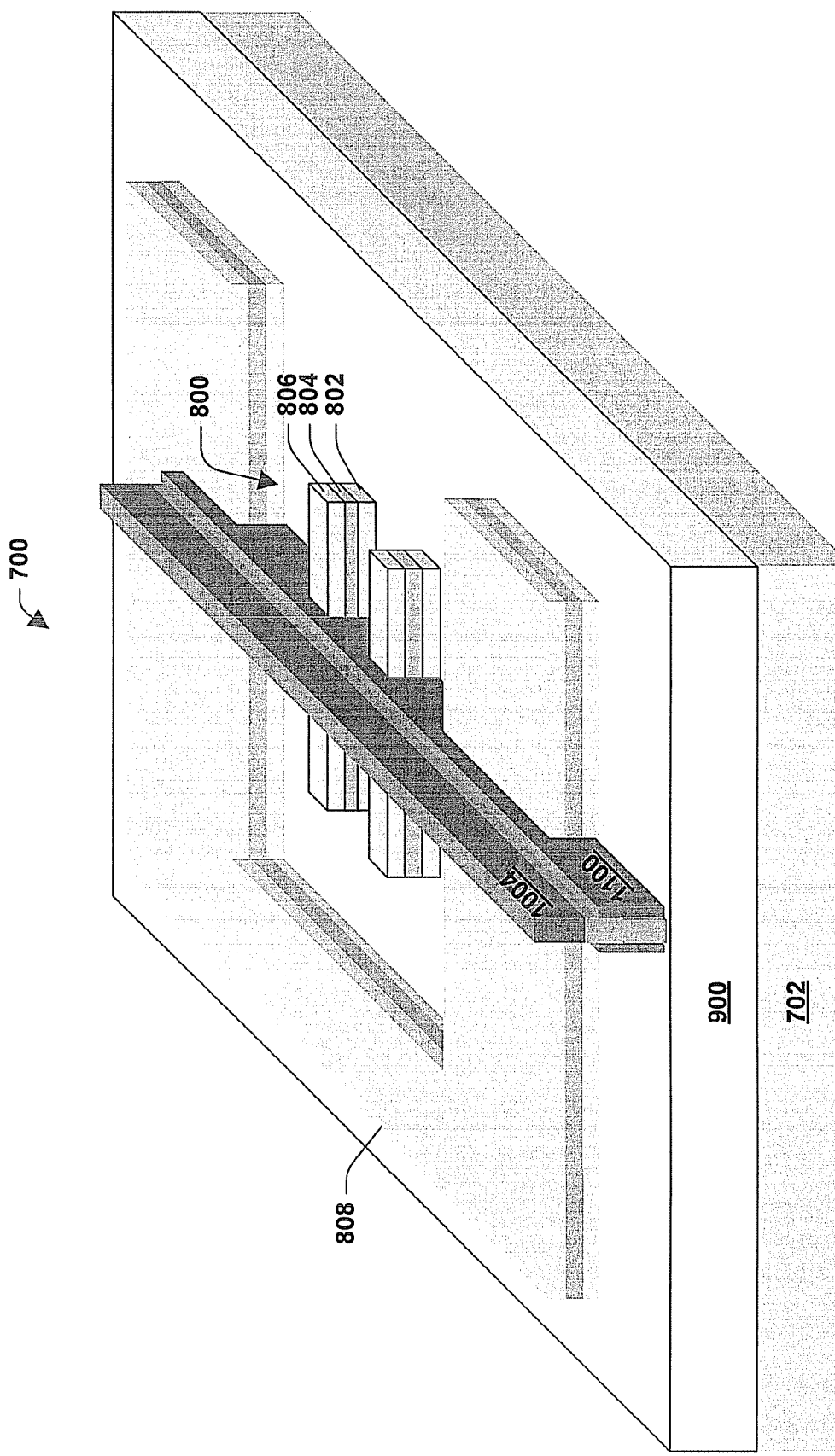

FIG. 11 illustrates forming first spacers 1100 adjacent to the side surfaces of the gate electrode 1000. The first dielectric spaces can contain a suitable dielectric material (e.g., silicon oxide, silicon nitride, or the like). The first spacer can be formed by employing suitable techniques including CVD followed by an etching away and/or etching back one or more portions. The first spacers cover the metal portion of the gate electrode, and the first spacer can serve as an etch mask that protects the metal layer during a subsequent etching process that removes the silicon germanium portion.

Figure 12:
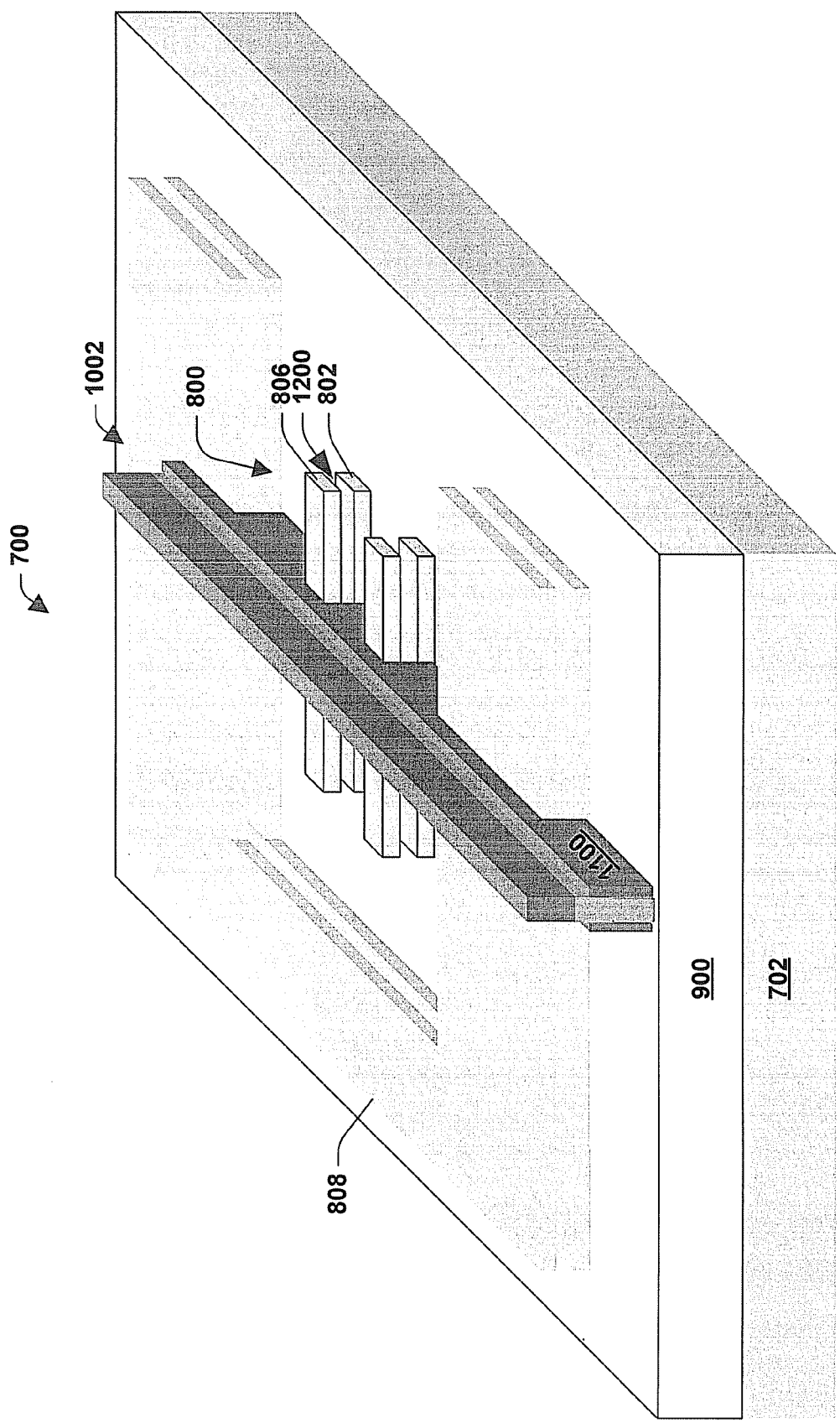
Figure 13:
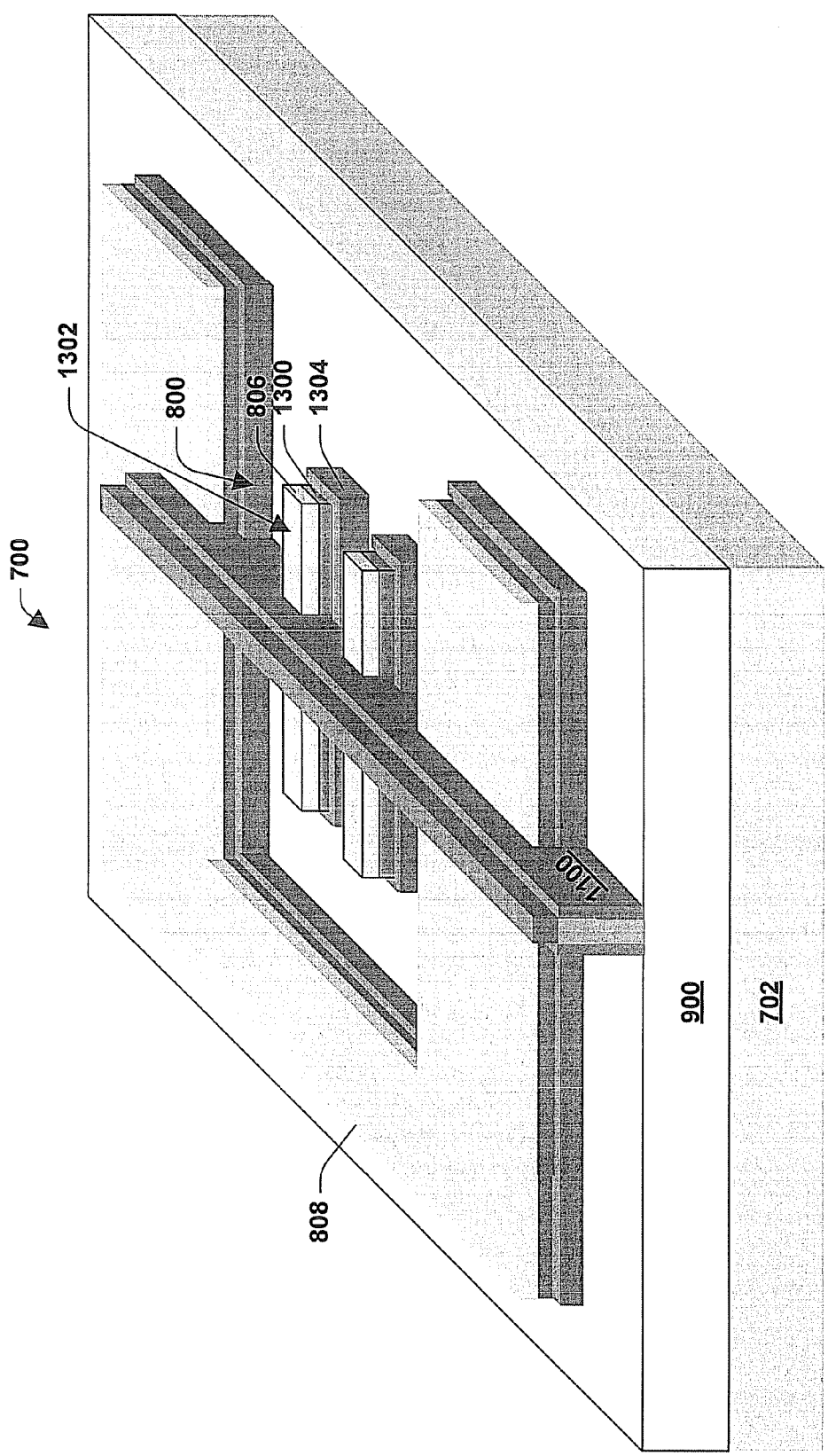

FIGS. 12 and 13 illustrate replacing the silicon germanium portions 804 with dielectric portions 1300. FIG. 12 illustrates removing the silicon germanium portions 804, thereby forming two or more first openings (e.g., cavities) 1200 between the convex potions 802 and silicon fins 806. FIG. 13 illustrates forming the two or more dielectric portions 1300 in the two or more openings 1200.

As illustrated in FIG. 12, the two or more silicon germanium portions 804 can be removed by etching, and two or more first openings 1200 are formed. The integrity of the metal portion of gate electrode is not affected and/or damaged by the etching. This is because the metal portion of gate electrode is covered by the high-k portion, the polysilicon portion of the gate, and/or the first spacers 1100. The metal portion is not exposed to the etchant during etching the silicon germanium, since the gate structure is covered with the first spacers 1100.

The silicon germanium portion can be removed by contacting the silicon germanium portion with a suitable metal etchant that does not substantially affect or damage the integrity of other layers/components of the field effect transistor. The silicon germanium portion can be removed by dry etching with an acidic gas (e.g., HCl gas). Other examples of metal etchants include an oxidizing etchant solution. Examples of oxidizing etchants include an acidic solution containing, for example, $H_2SO_4/H_2O_2$, $HNO_3/H_2O_2$, HCl/ $H_2O_2$, $H_2O_2/NH_4OH/H_2O$, $H_3PO_4$, $HNO_3$, $CH_3COOH$, or the like.

As illustrated in FIG. 13, the two or more dielectric portions 1300 are formed in the first openings 1200. The dielectric portion can be formed by a suitable technique (e.g., oxidation, deposition, or the like). For example, the dielectric portion is formed by depositing one or more layers containing dielectric materials over the exposed surfaces of the intermediate transistor (e.g., upper surfaces of convex portions of the bulk silicon substrate and lower surfaces of silicon fins) via CVD, followed by an etching away and/or etching back one or more portions of the dielectric layers. When the dielectric portion is an ONO portion, a first silicon oxide layer (not shown) is formed over the exposed surfaces of the intermediate transistor, a silicon nitride layer (not shown) is formed over the first silicon oxide, and a second silicon oxide layer (not shown) is formed over the silicon nitride layer. In another embodiment, the dielectric portion can be formed by low temperature plasma-enhanced chemical vapor deposition (PECVD). The plasma-grown oxide may be referred to as a snow oxide. The dielectric portion can contain a plasma-grown oxide that is grown at a temperature of about 200 degrees Celsius or more and about 400 degrees Celsius or less.

Portions of the dielectric layers formed over the exposed surfaces of the intermediate transistor can be removed by etching (e.g., dry etching including anisotropic etching). Examples of anisotropic dry etching include reactive ion etching (RIE) containing $CH_3F/Ar/O_2$, $CHF_3/Ar$, or the like. The portions can be removed by etching under a suitable condition as long as the two or more silicon fins are exposed as a result of the etching. Optimizing and/or controlling the etching conditions (e.g., etching period of time), the amount of the remaining portions of the dielectric layers can be controlled. As illustrated in FIG. 13, dielectric portions between the convex portions and dielectric portions in a source/drain region 1302 can remain, thereby forming second spacers 1304 in the source/drain region. In other words, dielectric potions adjacent to side surfaces of convex portions can remain. The second spacers adjacent to side surfaces of convex portions can prevent and/or mitigate the short between the silicon fin and the convex portion of the bulk silicon substrate. In one embodiment, dielectric portions adjacent to side surfaces of the neighboring transistor portions can remain. In FIG. 13, the convex portions 802 is covered with the second spacers 1304 and is not shown on the figure.

Figure 14:
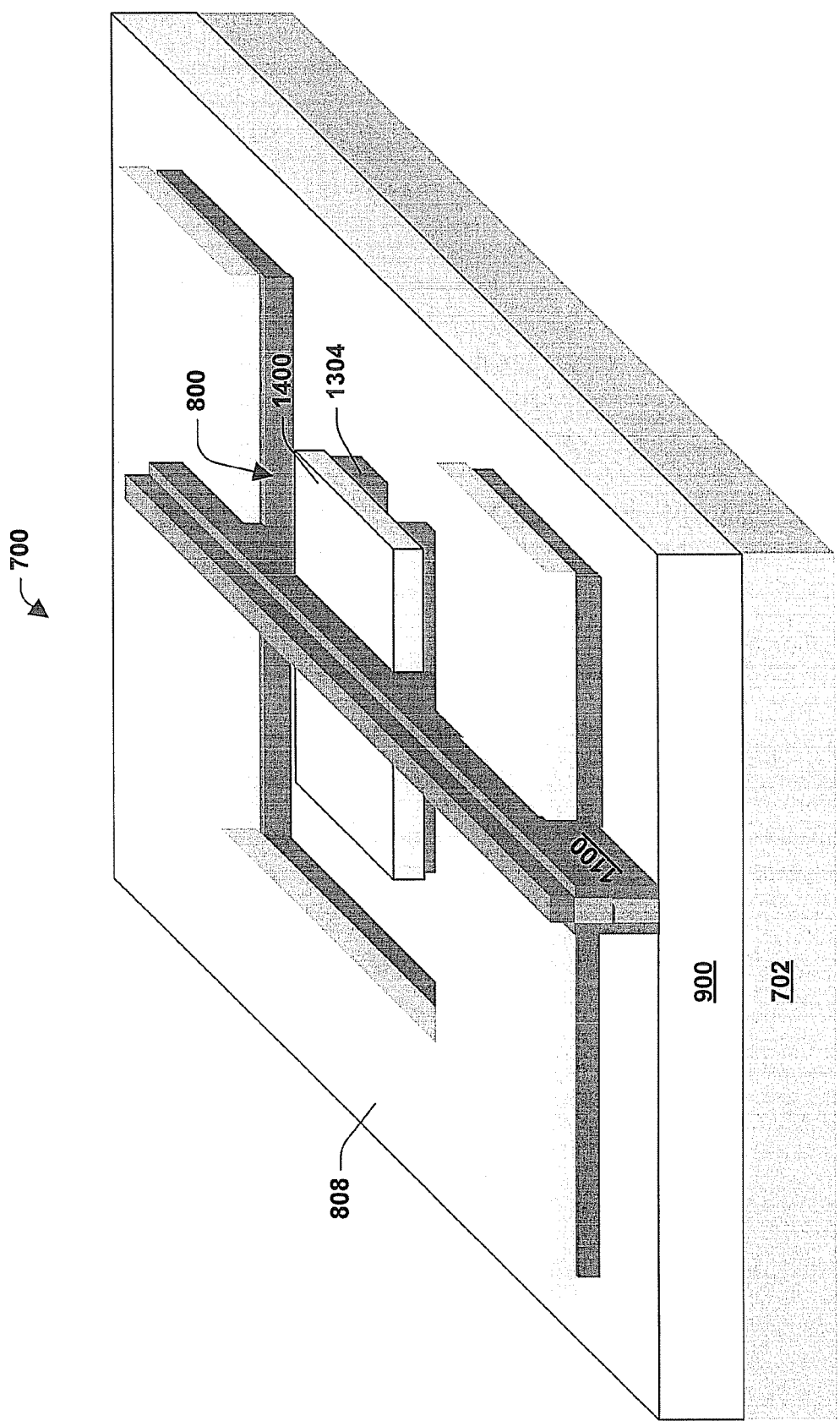

FIG. 14 illustrates forming a laterally grown silicon portion 1400 that can decrease source and drain (S/D) resistance and/or electrically connect the silicon fins 806 in the source/drain regions 1302. The laterally grown silicon portion can be formed by a suitable technique. The laterally grown silicon portion 1400 can be formed by a silicon epitaxial process. In the silicon epitaxial process, silicon epitaxial layers are formed over the surface of the silicon fin. The silicon epitaxial layer can grow at least laterally, thereby widening the width of the silicon fin. The silicon epitaxial layer can grow vertically at the same time. The silicon epitaxial growth can proceed under a suitable condition, for example, at elevated temperatures (e.g., 1,100 degrees Celsius using $SiCl_4$ as a source gas and $H_2$ as a carrier gas). The laterally grown silicon portion does not electrically connect the silicon fin and the convex portion. The laterally grown silicon portion does not electrically connect the silicon fins in the gate region.

Figure 15:
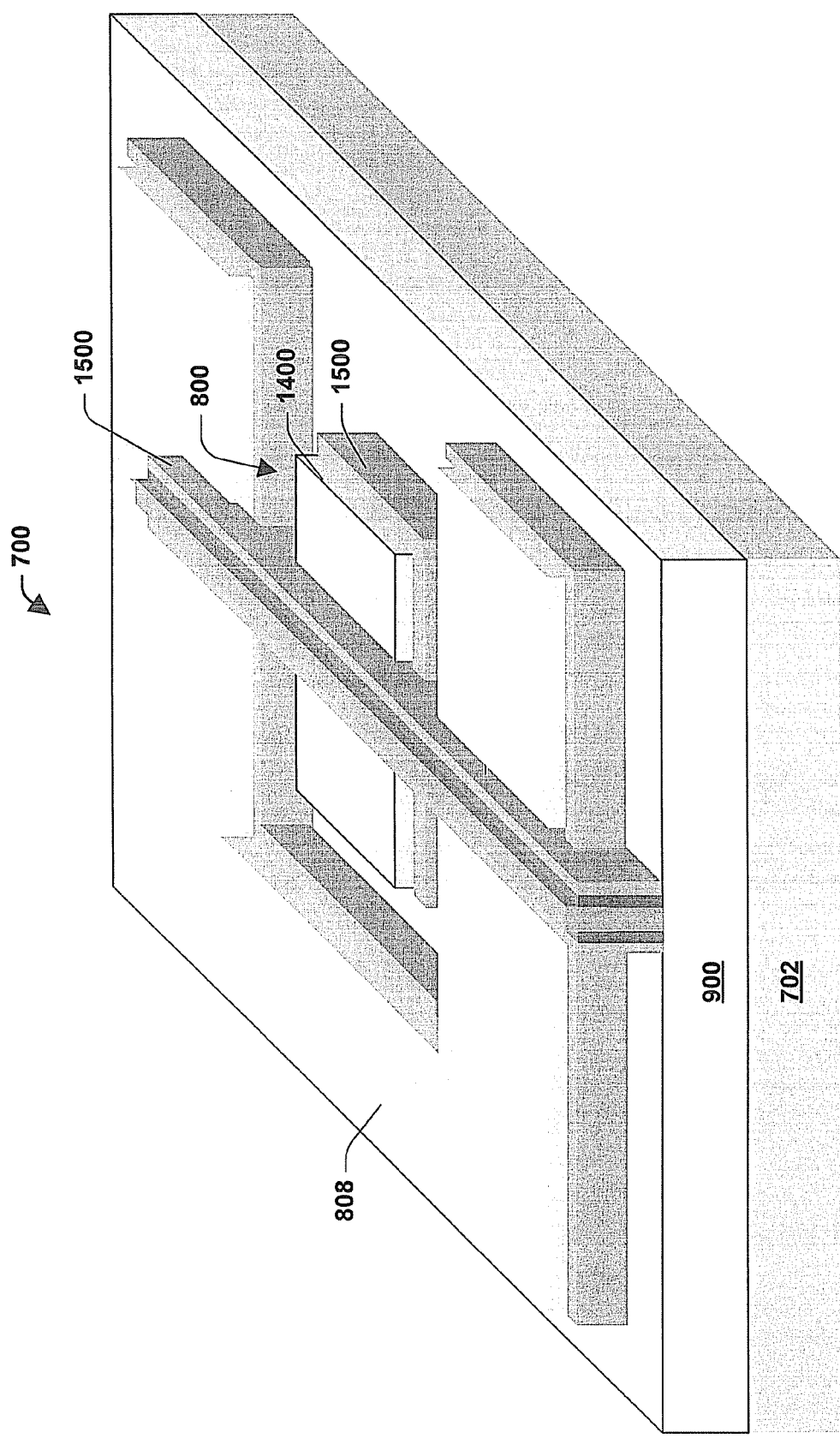

FIG. 15 illustrates optionally forming third spacers 1500 adjacent to side surfaces of second spacers, dielectric portions, gate electrode, or combinations thereof. The third spacers can contain a suitable dielectric material (e.g., silicon oxide, silicon nitride, or the like). The third spacers can be formed by a suitable technique including CVD, with an optional patterned mask, followed by an etching away and/or etching back one or more portions.

Although not shown in FIG. 15, source/drain portions are formed in the two or more silicon fins and in the laterally grown silicon portion in the source drain regions in the same manner as described in connection with FIG. 2B. A suitable implant compositions and concentrations can be employed for the source/drain portions. For example, the source/drain portions include one or more p-type dopants (e.g., boron) or n-type dopants (e.g., arsenic).

The source/drain portion can be formed by a suitable technique. The source/drain portion can be formed by implantation of one or more dopants. The source/drain portion can be formed by implant with a relatively high energy level and/or a relatively high dose of dopants. In one embodiment, the source/drain portion is formed at an energy level of about 2 KeV or more and about 15 KeV or less and a dose of about $5E14$ atoms/cm$^2$ or more and about $5E15$ atoms/cm$^2$ or less.

Although not shown in FIG. 15, metal silicides can be formed over the laterally grown silicon portions. Metal silicides can be formed on the upper surface of the polysilicon portion of the gate electrode. The metal silicides can be formed by a chemical reaction of a metal layer formed over the transistor with silicon of the laterally grown silicon portion 1400 and/or polysilicon portion of the gate electrode.

Although not shown, a metal layer is formed over the transistor. The metal layer can contain a suitable metal compound that can be converted to metal silicides in a subsequent process. Examples of metals include refractory metals, such as tungsten, tantalum, molybdenum and the like; and metals of Group VIII of the Periodic Table, such as platinum, palladium, cobalt, nickel, and the like. The metal layer can be converted to form, in a subsequent heat treatment, a metal silicide compound with underlying silicon of the laterally grown silicon portion and/or polysilicon portion of the gate electrode. The metal layer can be formed by a suitable technique, for example, CVD, PVD, or the like. The metal layer can have a suitable thickness that depends on, for example, a desired thickness of the metal silicide formed in the subsequent process.

The metal layer can be converted to the metal silicides by heating the metal layer to cause a chemical reaction between the metal layer and the underlying silicon containing layer/component of the transistor. During the silicidation process, the metal of the metal layer can diffuse into the underlying silicon containing layer/component and form the metal silicides. As a result, the metal silicides can be selectively formed on the field effect transistor (e.g., the upper surface of the laterally grown silicon portions and/or the gate electrode).

The metal silicides can have a suitable height that depends on, for example, the desired implementations and/or the field effect transistor being fabricated. In one embodiment, the metal silicides have a height of about 5 nm or more and about 30 nm or less. In another embodiment, the metal silicides have a height of about 10 nm or more and about 25 nm or less.

Choice of suitable conditions and parameters (e.g., temperature, duration of heat treatment, and the like) of the silicidation process depends on, for example, the desirable dimensions (e.g., height) of the metal silicides, the configuration and/or constituent of the metal layer and/or the underlying silicon containing component/layer, the desired implementations and/or the field effect transistor being fabricated, and the like. For example, the metal silicides are formed by rapid thermal annealing (RTA).

Portions of the metal layer, for example, over the side spacers and the STIs can remain unreacted and can be removed by, for example, etching. The unreacted portions of the metal layer can be removed by contacting the unreacted metal portions with a suitable metal etchant that does not substantially affect or damage the integrity of other layers/components of the field effect transistor such as the metal silicides. Examples of metal etchants include an oxidizing etchant solution. Examples of oxidizing etchants include an acidic solution containing, for example, $H_2SO_4/H_2O_2$, $HNO_3/H_2O_2$, $HCl/H_2O_2$, $H_2O_2/NH_4OH/H_2O$, $H_3PO_4$, $HNO_3$, $CH_3COOH$, and the like. Other metal etchants can also be used as long as they are capable of removing the unreacted portions of the metal layer selective to other components/layers of the field effect transistor.

Although not shown, in another embodiment of forming a multi-gate metal oxide silicon transistor, a first patterned mask layer is not removed. The multi-gate metal oxide silicon transistor can be formed in the same manner as described in connection with FIGS. 7-15 except that a fist patterned mask 708 is not removed. The mask layer 708 remains in the resultant multi-gate metal oxide silicon transistor in the same manner as described in connection with FIGS. 3A and 3B.

Figure 16:
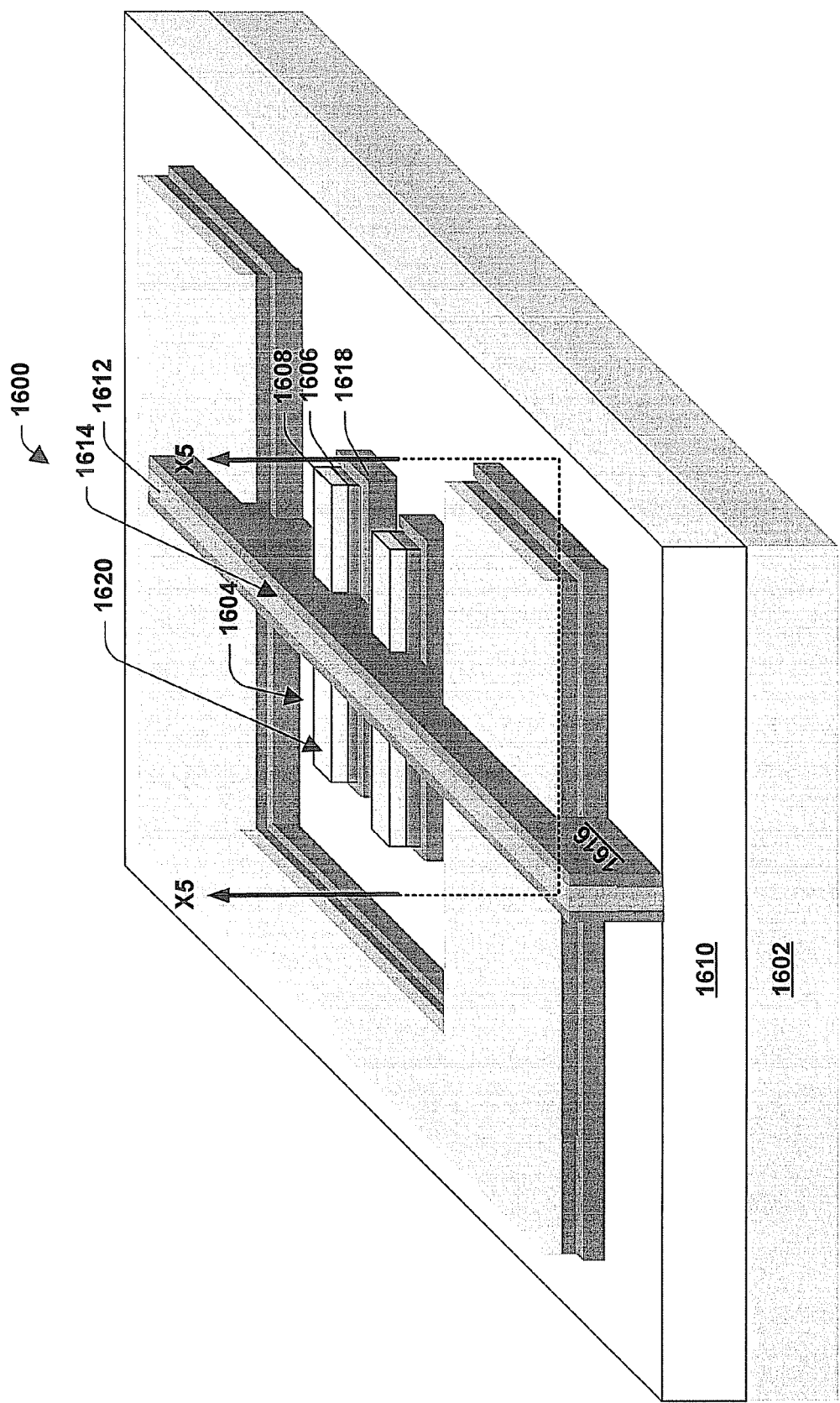
FIGS. 16-20 illustrate another exemplary methodology of forming a multi-gate metal oxide silicon transistor in accordance with an aspect of the subject innovation.

FIGS. 16-20 illustrate replacing a first gate electrode with a second gate electrode. The first gate electrode may be referred to as a dummy gate electrode. FIG. 16 illustrates a cross sectional view of an intermediate state of a portion of another exemplary multi-gate metal oxide silicon transistor 1600. The multi-gate metal oxide silicon transistor can contain a bulk silicon substrate 1602 containing two or more convex portions (not shown) between shallow trench regions 1604; two or more dielectric portions 1606 over the convex portions; two or more silicon fins 1608 over the dielectric portions; shallow trench isolation layers 1610 in the shallow trench isolation regions; a first gate electrode 1612 in a gate electrode region 1614, and a first polysilicon portion over the first metal portion; first spacers 1616 adjacent to the side surfaces of the gate electrode; and second spacers 1618 adjacent to side surfaces of the convex portions in a source/drain region 1620 in the same manner as described in connection with FIG. 13. The first gate electrode (e.g., dummy gate) can contain a silicon oxide layer (e.g., $SiO_2$ layer) and a polysilicon portion over the silicon oxide layer. The convex portions of the bulk silicon substrate and portions of the dielectric portion are covered with the second spacers, and not seen.

When the replacement gate process is performed, the first gate electrode does not need to contain a high-k portion, a metal portion, and a polysilicon portion because the first gate electrode is a dummy and replaced with a second gate electrode. The replacement gate process can be performed at a suitable time. The second gate electrode can be replaced with the first gate electrode (e.g., dummy gate) after forming a laterally grown silicon portion adjacent to the side surface of silicon fin.

Figure 17:
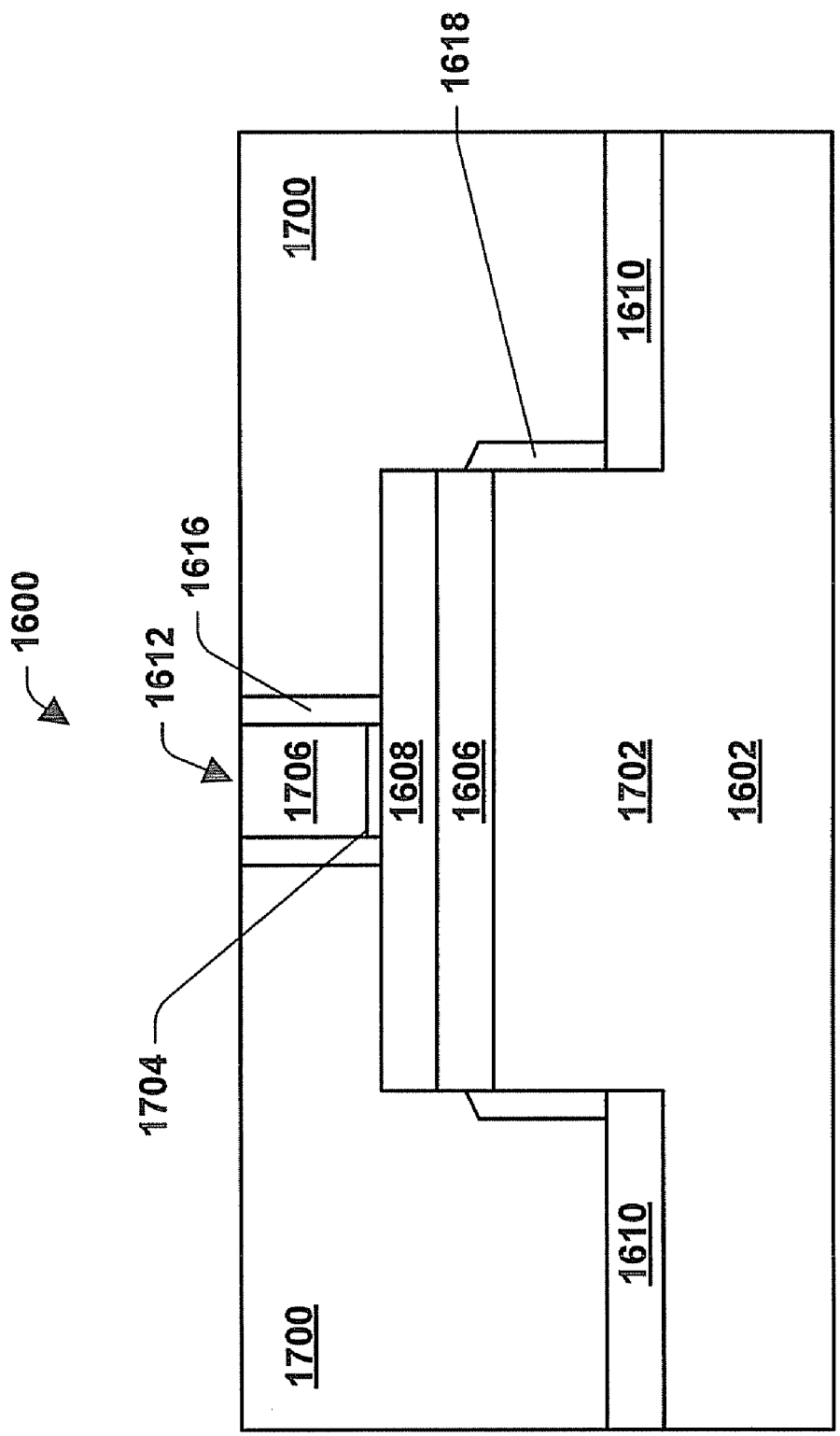

FIG. 17 is a cross sectional view of a portion of the field effect transistor 1600, such as that taken along line X5-X5 of FIG. 16. The line X5-X5 is drawn through the middle of the silicon fin 1608 along the long side of the silicon fin. FIG. 17 illustrates forming a pre-metal dielectric layer 1700 over the bulk silicon substrate. FIG. 17 illustrates the convex portion 1702 of the bulk silicon substrate and the first gate electrode 1612 containing a silicon oxide layer 1704 over the two or more silicon fins 1608 and a first polysilicon portion 1706 over the silicon oxide layer. The silicon oxide layer has a suitable height, for example, about 3 nm. The first polysilicon portion has a suitable height, for example, about 100 nm.

The upper surface of the pre-metal dielectric layer 1700 is substantially coplanar with the upper surface of the first polysilicon portion of the first gate electrode. In other words, the upper surface of the first polysilicon portion is exposed, but the silicon fins are covered with the pre-metal dielectric layer and not exposed.

The pre-metal dielectric layer can contain a suitable dielectric material. Examples of the dielectric materials include oxides such as silicon oxides (e.g., silicon oxide ($Si_xO_y$) and silicon dioxide ($SiO_2$)); nitrides such as silicon nitrides (e.g., silicon nitride ($Si_xN_y$), silicon rich nitride, and oxygen rich silicon nitride). The pre-metal dielectric layer typically contains silicon oxides. The pre-metal dielectric layer can be formed by a suitable technique, for example, by deposition (e.g., CVD, spin-on techniques, or the like), and CMP and/or etching techniques. When the pre-metal dielectric layer is formed by using CMP, the first spacers can be served as a CMP stop of the CMP process.

Figure 18:
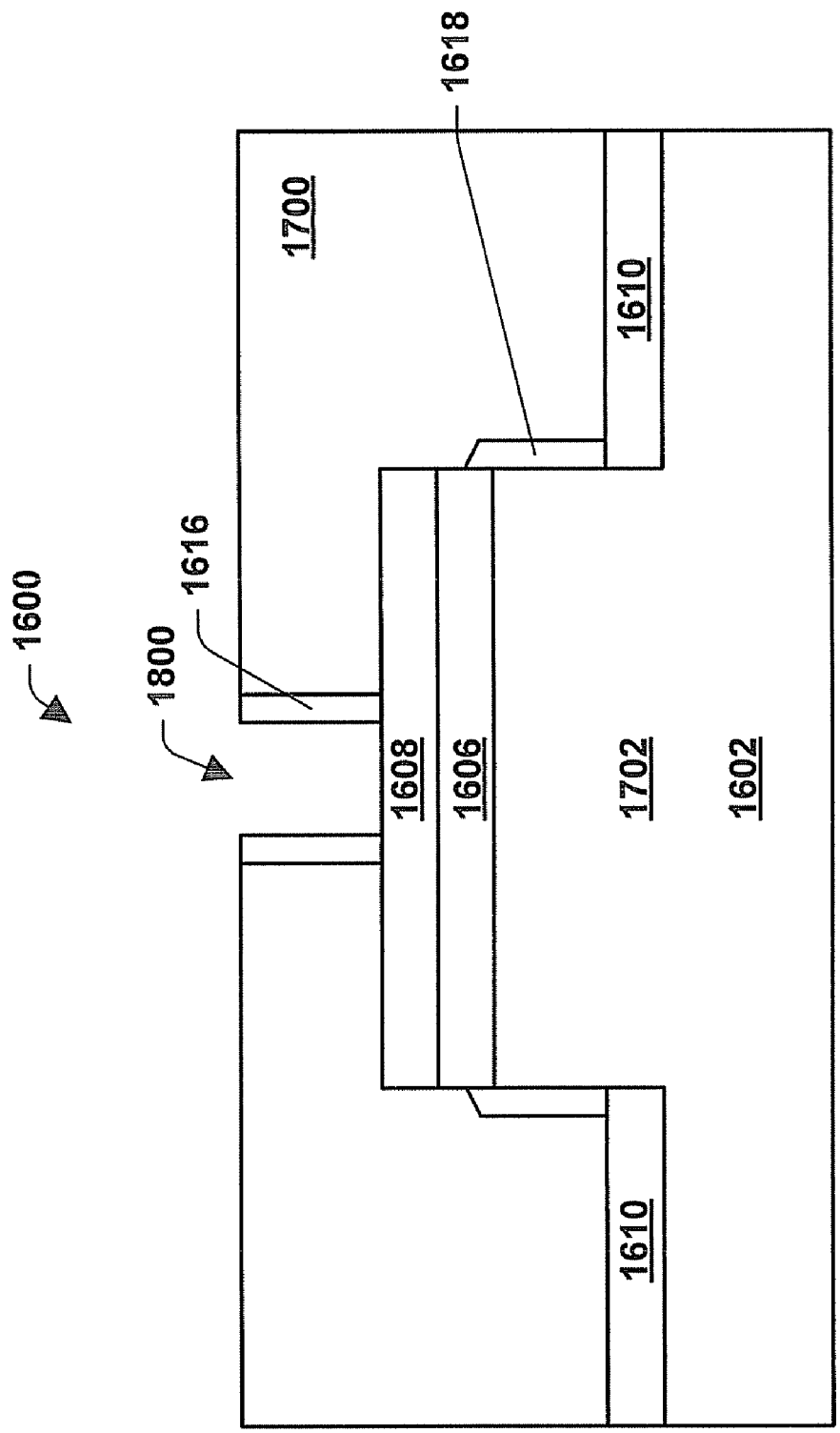

FIG. 18 illustrates removing the first gate electrode 1612, thereby forming a second opening 1800. A second gate electrode is formed in the second opening in subsequent processes. The first gate electrode can be removed by a suitable technique, for example, etching. Since the first gate electrode contains the first polysilicon portion 1706 and the silicon oxide layer 1704, the first gate electrode can be removed by using a suitable etchant including polysilicon etchants and etchants for silicon oxides. Examples of polysilicon etchants include TMAH, alkali metal hydroxides (e.g., a potassium hydroxide (KOH) and cerium hydroxide (CeOH)), or the like.

Figure 19:
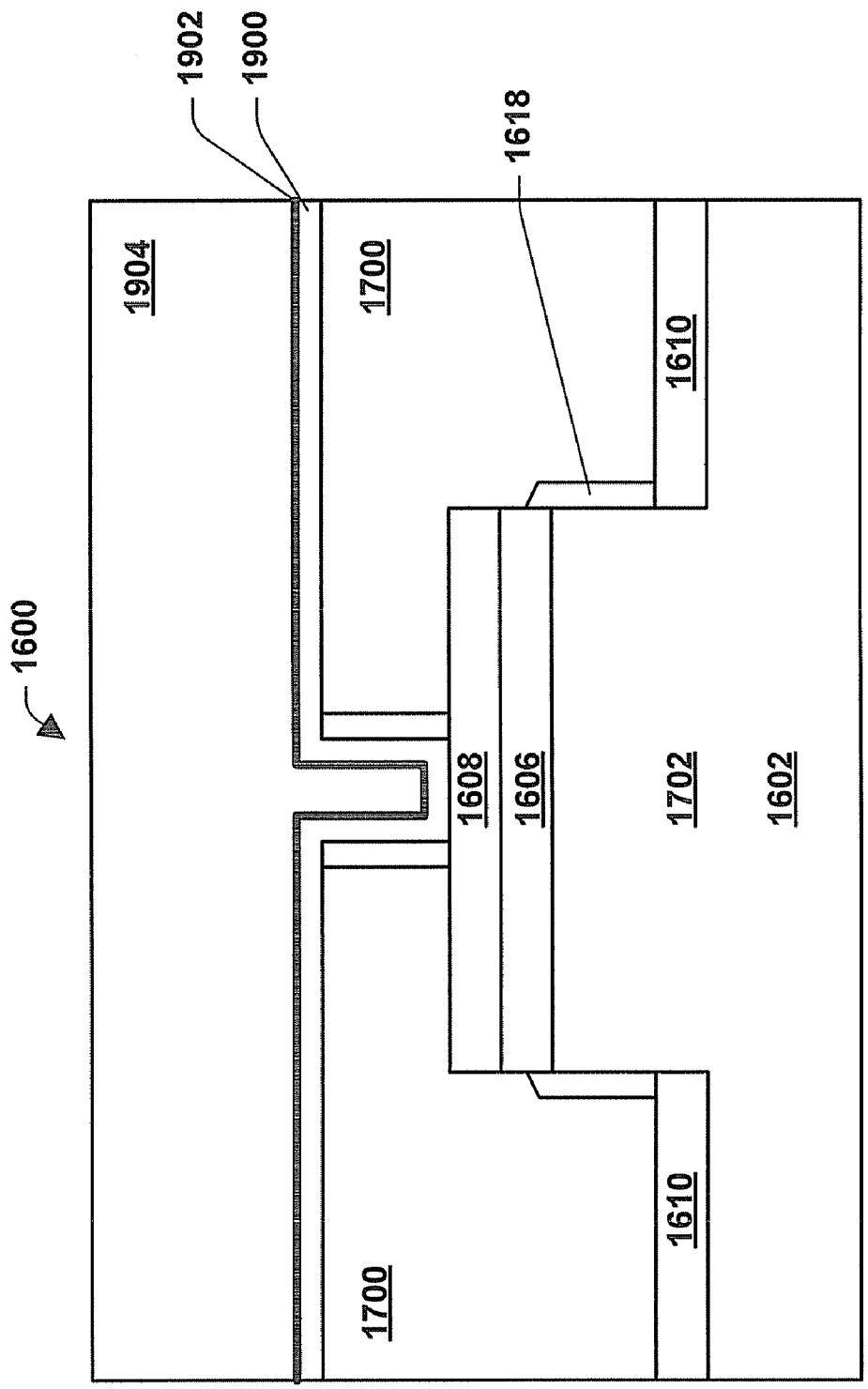

FIG. 19 illustrates fowling a high-k layer 1900 over the second opening 1800, a metal layer 1902 over the high-k layer, and a polysilicon layer 1904 over the metal layer. The three layers are formed over the upper surface of the silicon fins in the gate region, over the side surfaces of the first spacers and the upper surfaces of the pre-metal dielectric layer. These layers can contain the same materials as the high-k layer, the metal layer, and the polysilicon layer as described in connection with FIG. 1. These layers can be formed in the same manners as described in connection with FIG. 10.

Figure 20:
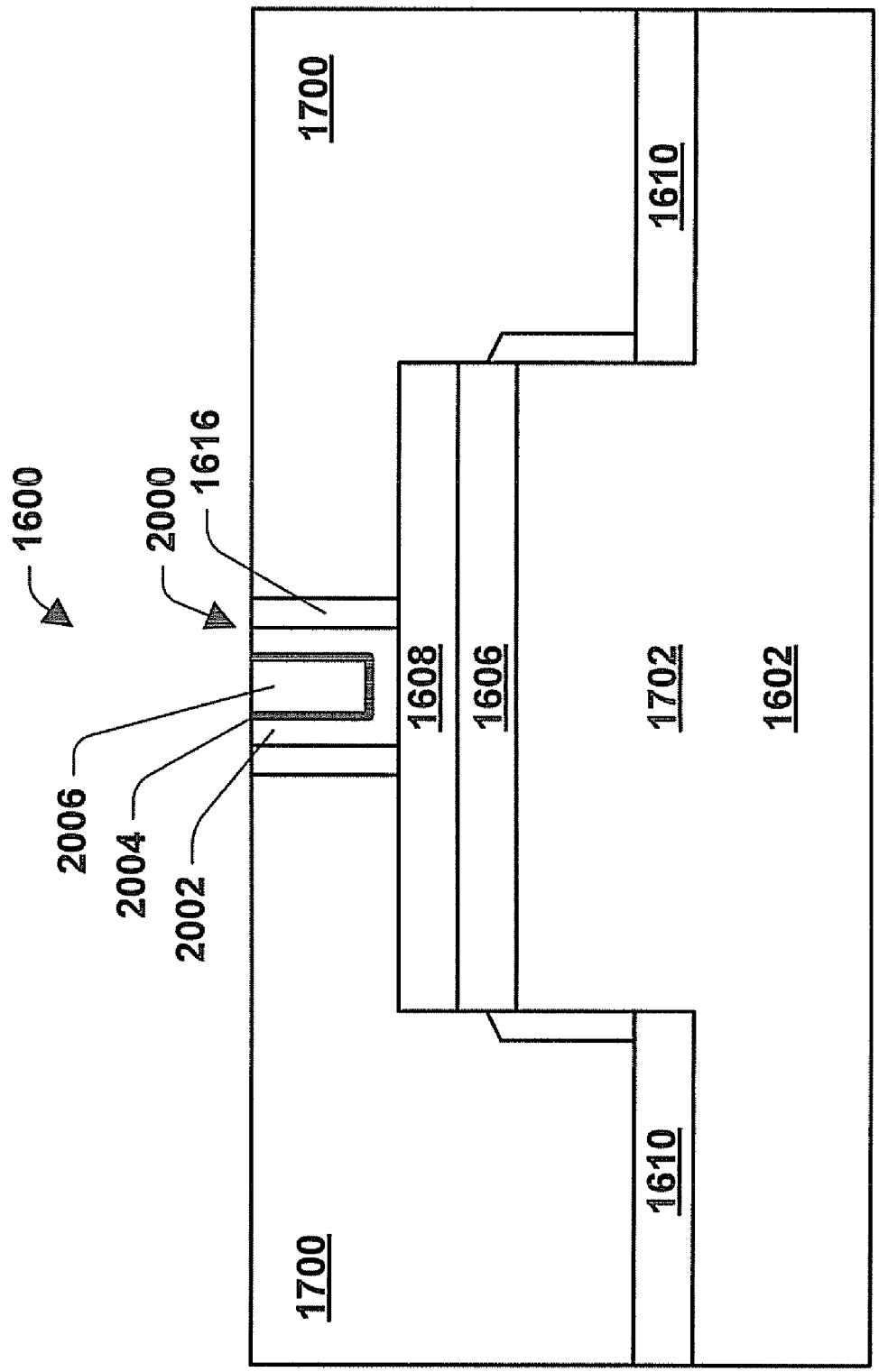

FIG. 20 illustrates forming a second gate electrode 2000. The second electrode can contain suitable gate electrode materials including a second high-k portion 2002, a second metal portion 2004, and a second polysilicon portion 2006 in the second opening 1800. The second gate electrode can be formed by removing portions of the high-k layer, the metal layer, and the polysilicon layer over the pre-metal dielectric layer. The upper surface of the second gate electrode can be coplanar with the upper surface of the first spacer. The portions of the high-k layer, the metal layer, and the polysilicon layer can be removed by CMP and/or etching.

Figure 21:
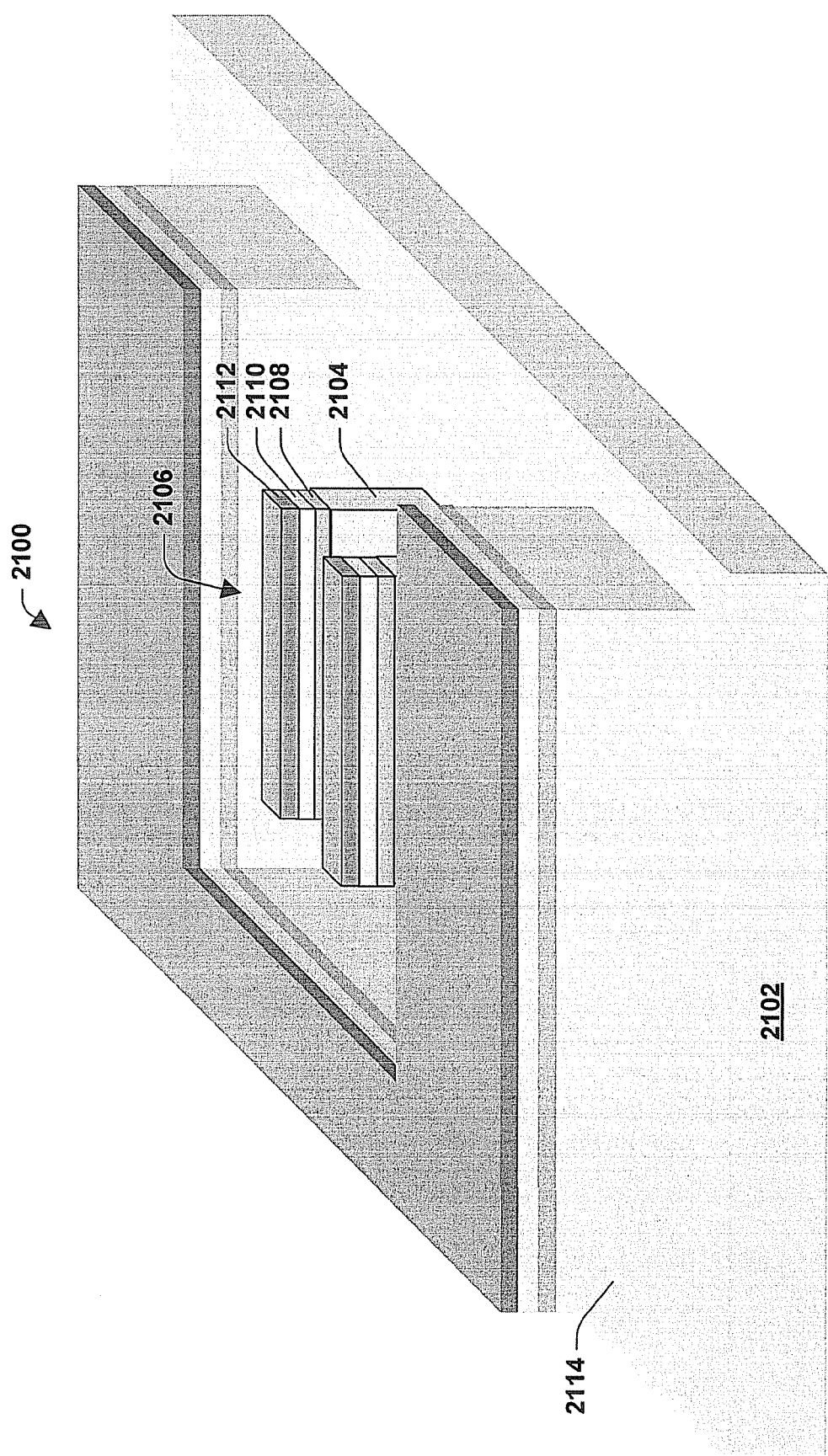
FIGS. 21-26 illustrate another exemplary methodology of forming a multi-gate metal oxide silicon transistor in accordance with an aspect of the subject innovation.

FIG. 21 illustrates a cross sectional view of an intermediate state of a portion of another exemplary multi-gate metal oxide silicon transistor 2100. The multi-gate metal oxide silicon transistor can contain a bulk silicon substrate 2102 containing two or more convex portions 2104 between shallow trench regions 2106; two or more silicon germanium portions 2108 over the convex portions; and two or more silicon fins 2110 on the silicon germanium portions in the same manner as described in connection with FIG. 8. The convex portions, silicon germanium portions, and silicon fins can be formed by etching using a patterned mask layer 2112 as an etch mask. One or more neighboring transistor portions 2114 can be disposed adjacent to the transistor 2100.

Figure 22:
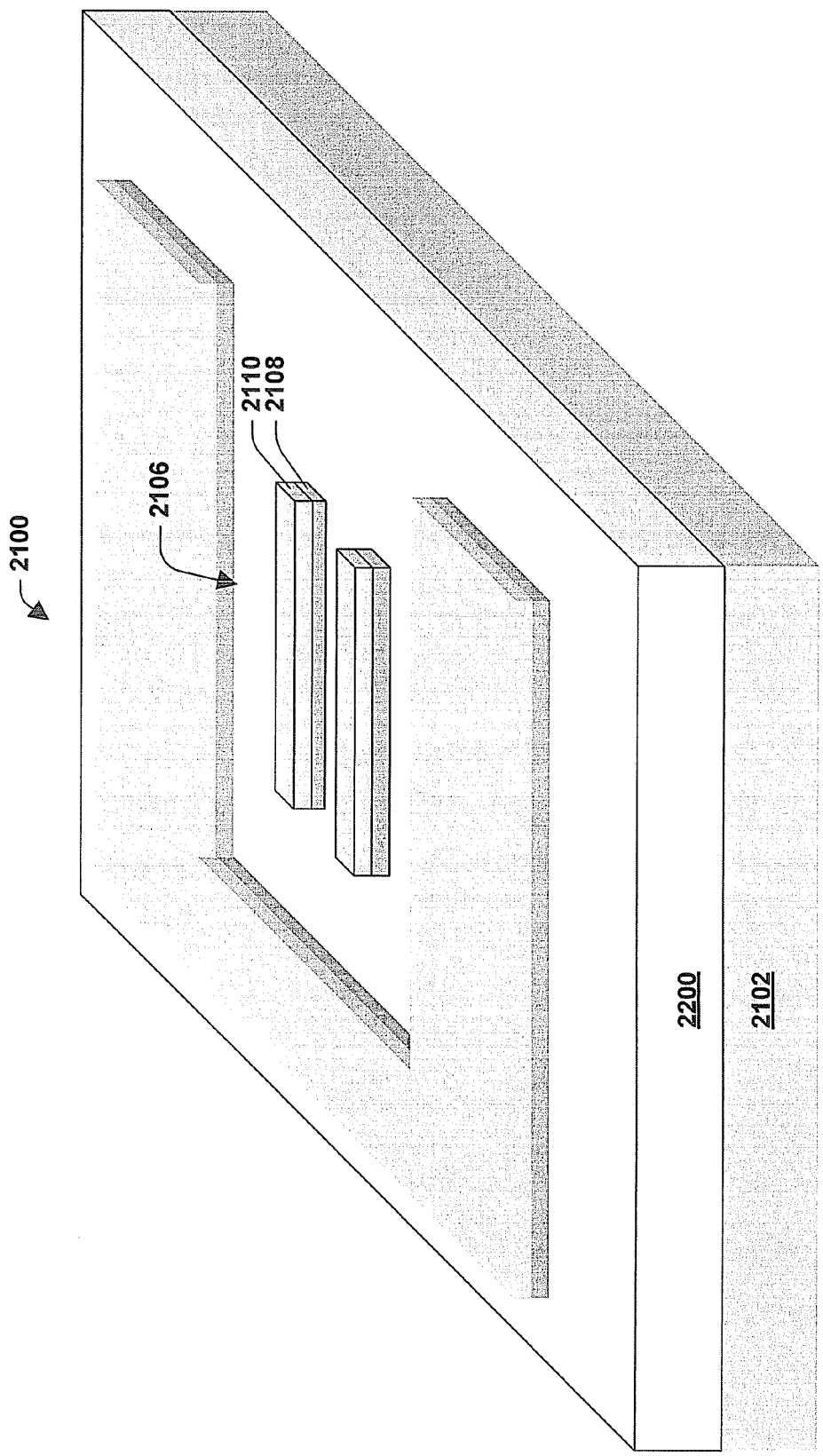

FIG. 22 illustrates forming a shallow trench isolation layer 2200 in the shallow trench isolation regions 2106. The shallow trench isolation layer can be formed in the same manner as described in connection with FIG. 9. The shallow trench isolation layer has a suitable height as long as the upper surface of the shallow trench isolation layer is located between the lower surface and the upper surface of silicon germanium portion. The height of the shallow trench isolation layer is greater than the height of the convex portion. Since the upper surface of the shallow trench isolation layer is located between the lower surface and the upper surface of silicon germanium portion, a lower portion of the silicon germanium portion is surrounded with the shallow trench isolation layer, and upper portion of the silicon germanium portion is protruded above the upper surface of the shallow trench isolation layer.

In one embodiment, the height of the shallow trench isolation layer is about 15 nm or more and about 140 nm or less. In another embodiment, the height of the shallow trench isolation layer is about 15 nm or more and about 120 nm or less. In yet another embodiment, the height of the shallow trench isolation layer is about 15 nm or more and about 90 nm or less.

Figure 23:
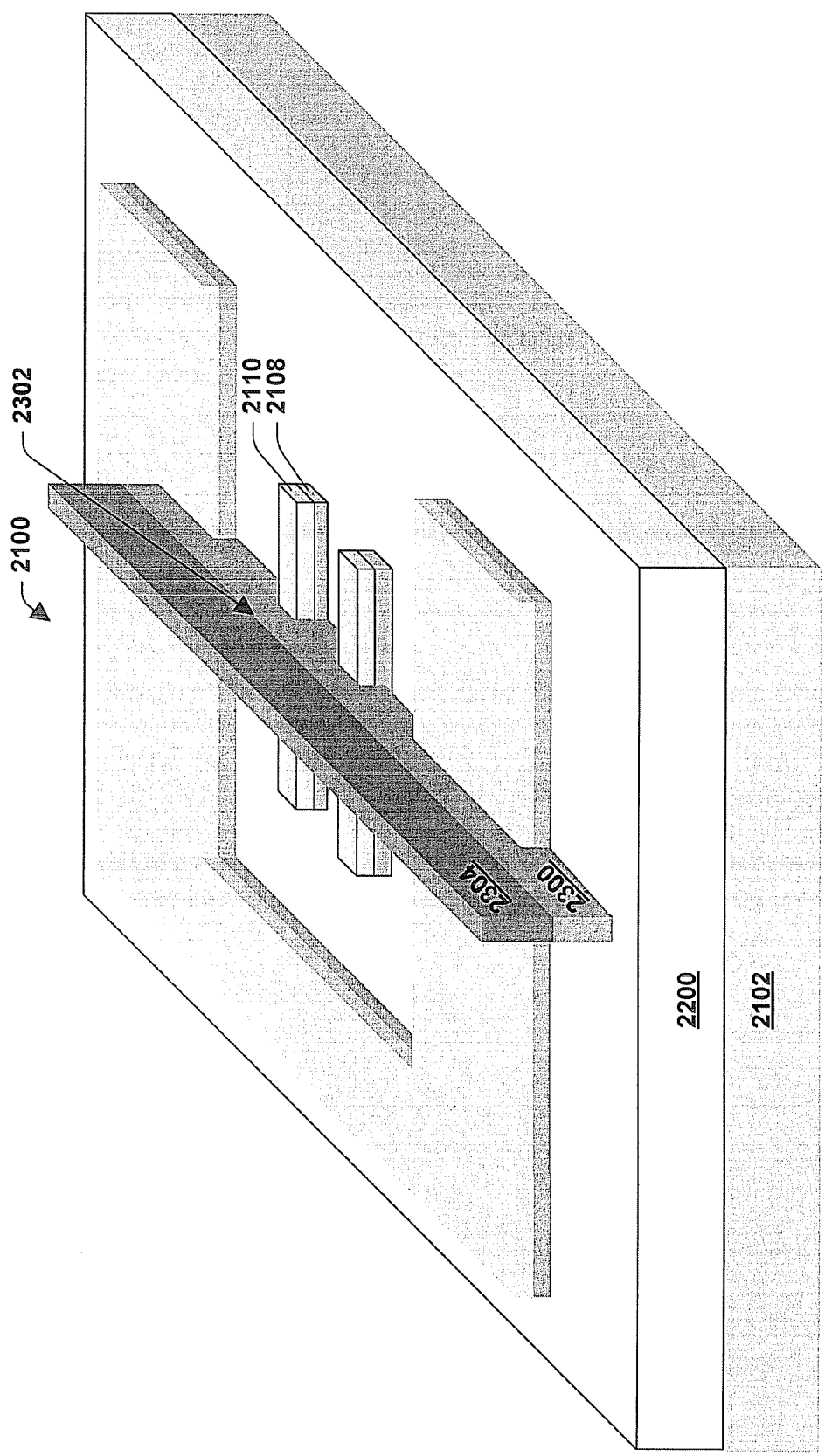

FIG. 23 illustrates forming a gate electrode 2300 over the silicon fins in a gate electrode region 2302. The gate electrode can be formed in the same manner as described in connection with FIG. 10. The gate electrode can contain a high-k portion over the silicon fins, a metal portion over the high-k portion, and a polysilicon portion over the metal portion in the same manner as described in connection with FIG. 5A. The gate electrode can be formed by forming a high-k layer over the bulk silicon substrate (e.g., silicon fins) by suitable techniques including CVD, forming a metal layer over the high-k layer by suitable techniques including CVD and physical vapor deposition (PVD), and forming a polysilicon layer over the high-k layer by deposition (e.g., CVD, spin-on techniques, and the like), and then patterning the high-k layer, the metal layer, and the polysilicon layer by lithography and etching techniques using a second patterned mask layer 2304.

Figure 24:
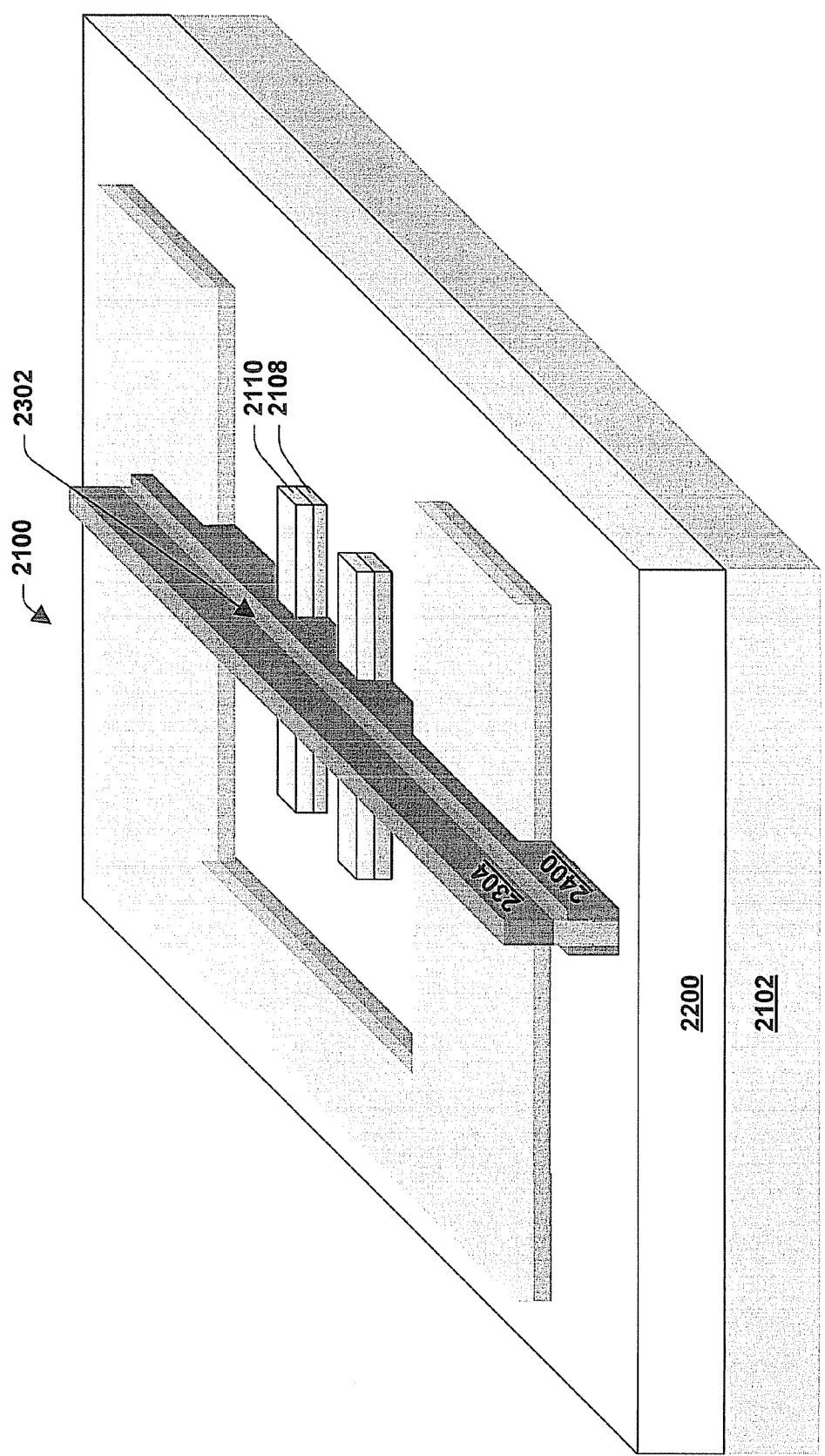

FIG. 24 illustrates forming first spacers 2400 adjacent to the side surfaces of the gate electrode 2300. The first dielectric spaces can contain a suitable dielectric material (e.g., silicon oxide, silicon nitride, or the like). The first spacer can be formed in the same manner as described in connection with FIG. 11.

Figure 25:
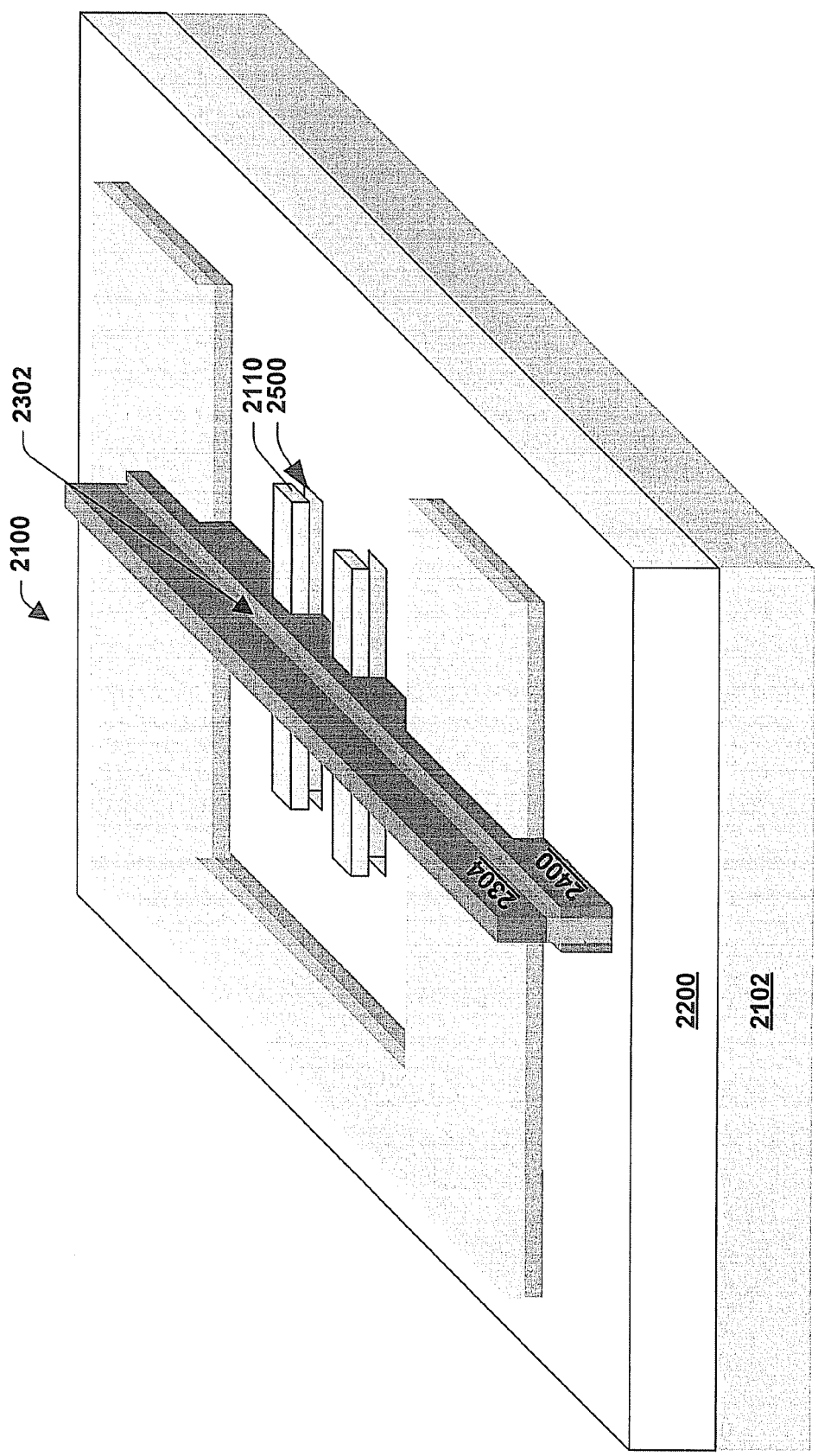
Figure 26:
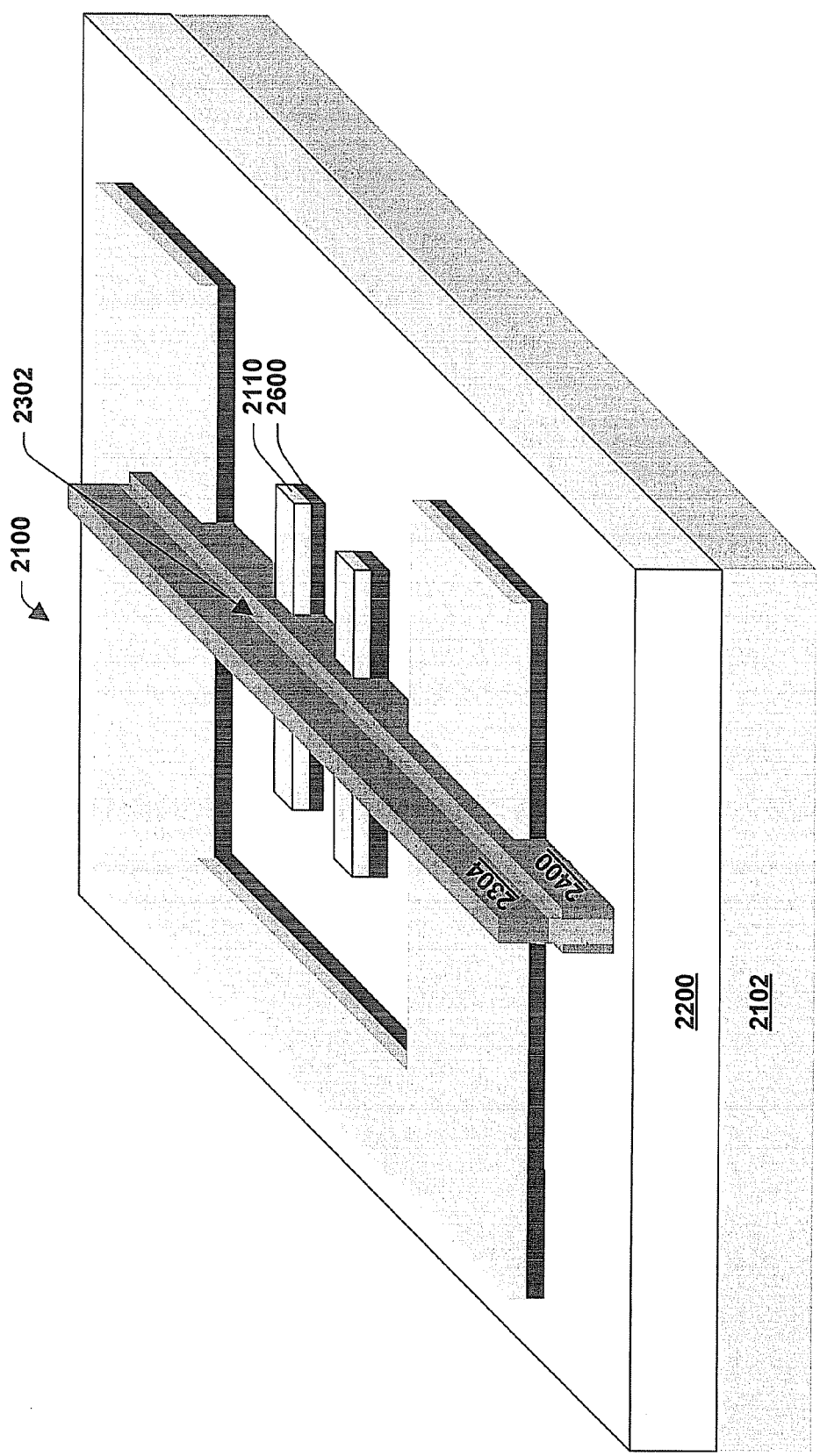

FIGS. 25 and 26 illustrate replacing the silicon germanium portions 2108 with dielectric portions. FIG. 25 illustrates removing the silicon germanium portions, thereby forming two or more first openings (e.g., cavities) 2500 between the convex potions and silicon fins. FIG. 26 illustrates forming the two or more dielectric portions 2600 in the two or more openings.

As illustrated in FIG. 25, the silicon germanium portions 804 can be removed by etching in the same manner as described in connection with FIG. 12. The integrity of the metal portion of gate electrode is not affected and/or damaged by the etching. This is because the metal portion of gate electrode is covered by the high-k portion, the polysilicon portion of the gate, and/or the first spacers 2400. The metal portion is not exposed to the etchant during etching the silicon germanium.

As illustrated in FIG. 26, the two or more dielectric portions 2600 are formed in the first openings 2500. The dielectric portion can be formed by a suitable technique in the same manner as described in connection with FIG. 13. In this example, spacers are not formed adjacent to the side surfaces of the convex portions 2104 because the convex portions are surrounded with the shallow trench isolation layer 2200. The shallow trench isolation layer can prevent and/or mitigate the short between the silicon fin and the convex portion of the bulk silicon substrate.

Although not illustrated in Figures, after forming the dielectric portions, a laterally grown silicon portion can be formed in the same manner as described in FIG. 14. Third spacers, source/drain portions, and/or metal silicides can be optionally formed in the same manner as described in connection with FIG. 15.

Although not illustrated in Figures, in another embodiment of forming a multi-gate metal oxide silicon transistor, the gate electrode 2300 is replaced with a second gate electrode after forming the dielectric portions. The gate electrode can be removed and the second gate electrode can be formed in the same manner as described in connection with FIGS. 16-20.

Although not illustrated in Figures, in another embodiment of forming a multi-gate metal oxide silicon transistor, a first patterned mask layer 2112 is not removed. The multi-gate metal oxide silicon transistor can be formed in the same manner as described in connection with FIGS. 21-26 except that a fist patterned mask 2112 is not removed. The mask layer 2112 remains in the resultant multi-gate metal oxide silicon transistor in the same manner as described in connection with FIGS. 6A and 6B.

Figure 27:
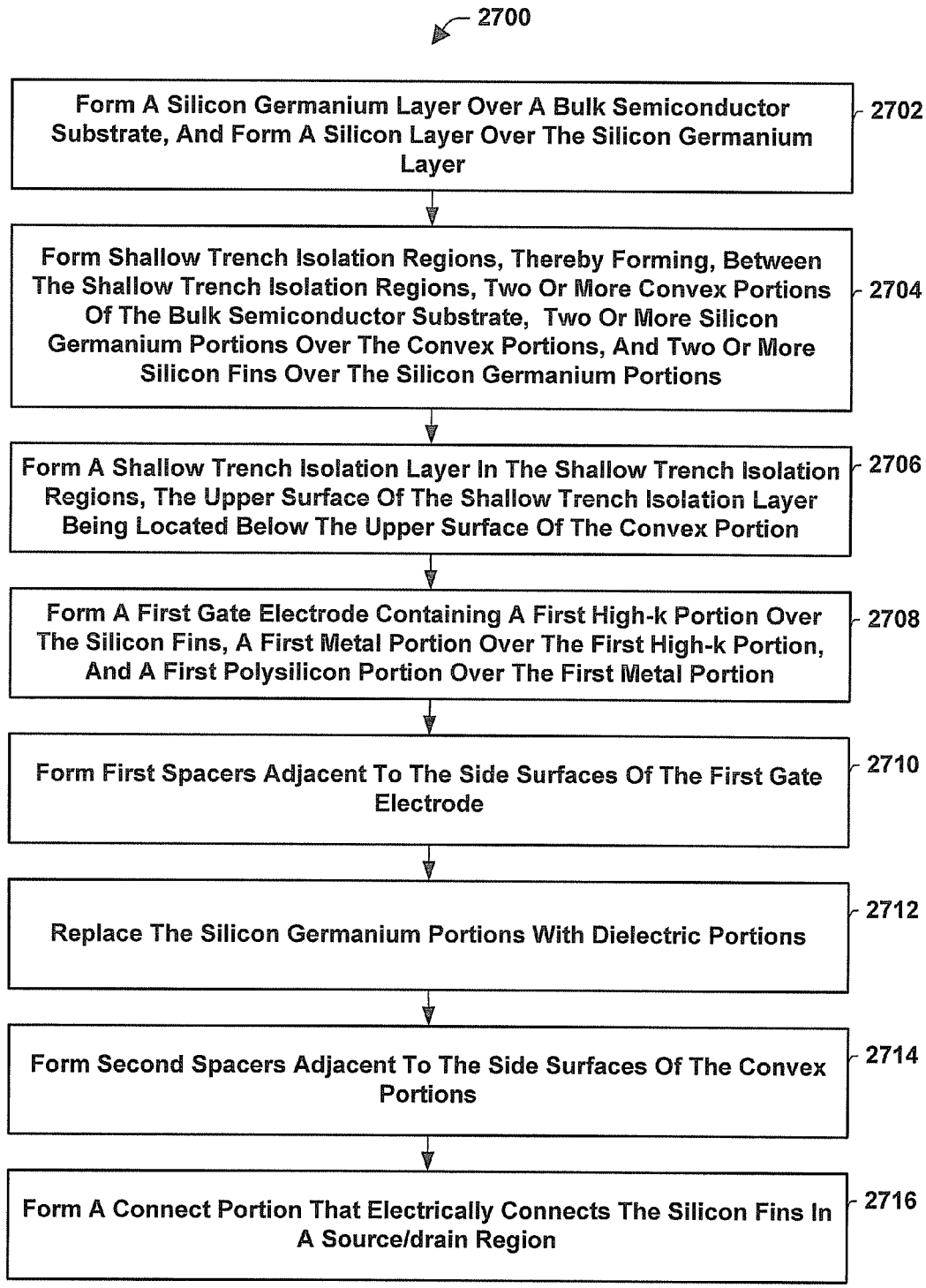
FIG. 27 is a flow diagram of an exemplary methodology of forming a multi-gate metal oxide silicon transistor in accordance with an aspect of the subject innovation.

FIG. 27 illustrates an exemplary methodology 2700 of forming a multi-gate metal oxide silicon transistor. At 2702, a silicon germanium layer is formed over a bulk silicon substrate, and a silicon layer is formed over the silicon germanium layer. At 2704, shallow trench isolation regions are formed in the bulk silicon substrate, thereby forming, between the shallow trench isolation regions, two or more convex portions of the bulk silicon substrate, two or more silicon germanium portions over the convex portions, and two or more silicon fins over the silicon germanium portions. At 2706, a shallow trench isolation layer is formed in the shallow trench isolation regions. The upper surface of the shallow trench isolation layer is located below the upper surface of the convex portion. At 2708, a first gate electrode is formed over the silicon fins. The first gate electrode contains a first high-k portion over the silicon fins, a first metal portion over the first high-k portion, and a first polysilicon portion over the first metal portion. At 2710, first spacers are formed adjacent to the side surfaces of the first gate electrode. At 2712, the silicon germanium portions are replaced with dielectric portions. At 2714, second spacers are formed adjacent to the side surfaces of the convex portions. At 2716, a laterally grown silicon portion is formed in a source/drain region.

Figure 28:
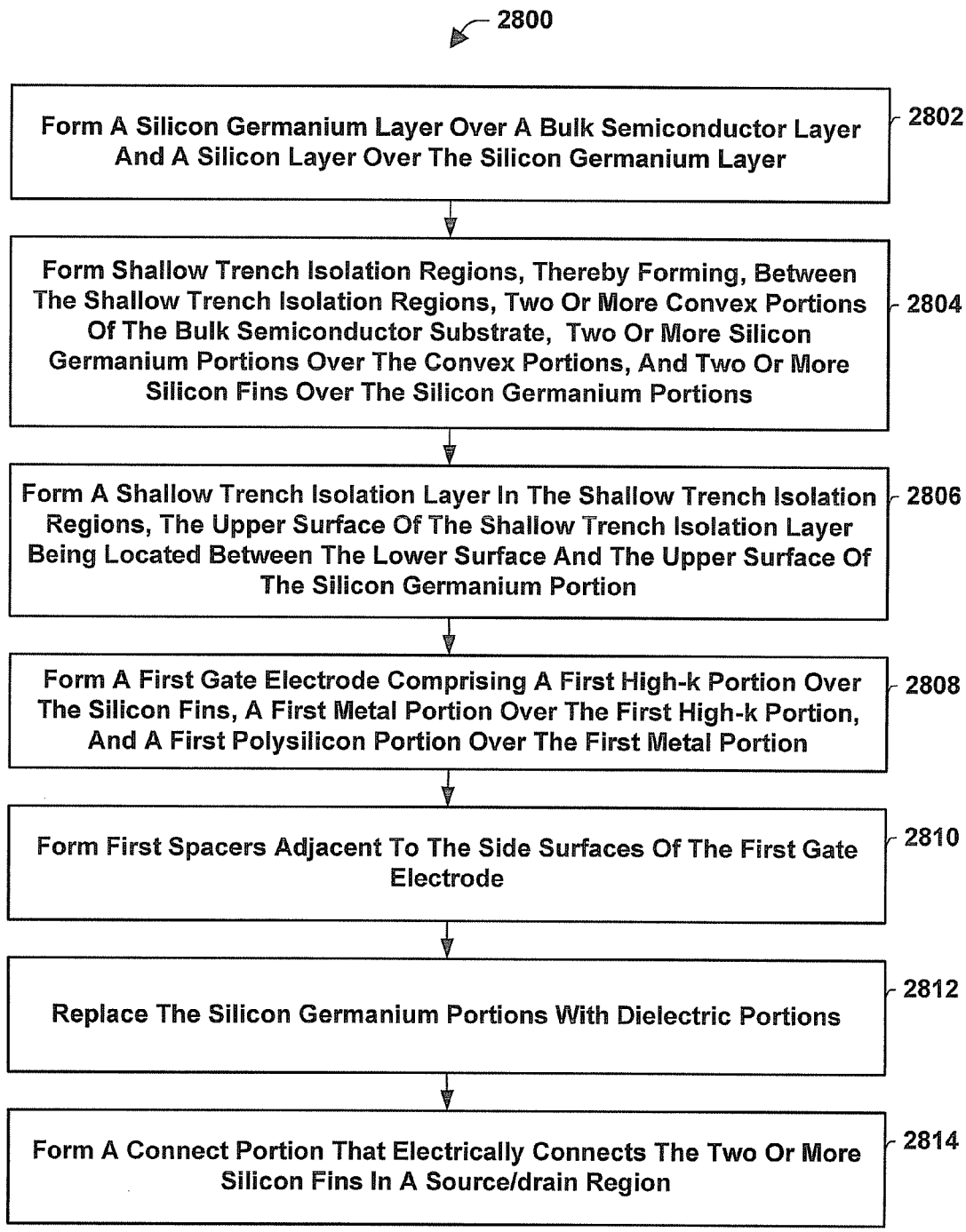
FIG. 28 is a flow diagram of an exemplary methodology of decreasing a cell area of a multi-gate metal oxide silicon transistor in accordance with an aspect of the subject innovation.

FIG. 28 illustrates another exemplary methodology 2800 of forming a multi-gate metal oxide silicon transistor. At 2802, a silicon germanium layer is formed over a bulk semiconductor layer, and a silicon layer is formed over the silicon germanium layer. At 2804, shallow trench isolation regions are formed in the bulk silicon substrate, thereby forming, between the shallow trench isolation regions, two or more convex portions of the bulk silicon substrate, two or more silicon germanium portions over the convex portions, and two or more silicon fins over the silicon germanium portions. At 2806, a shallow trench isolation layer is formed in the shallow trench isolation regions, the upper surface of the shallow trench isolation layer being located between the lower surface and the upper surface of the silicon germanium portion. At 2808, a first gate electrode is formed over the silicon fins. The first gate electrode contains a first high-k portion over the silicon fins, a first metal portion over the first high-k portion, and a first polysilicon portion over the first metal portion. At 2810, the two or more silicon germanium portions are replaced with two or more dielectric portions. At 2812, a laterally grown silicon portion is formed in a source/drain region.

Although not shown in FIGS. 27 and 28, when replacing the silicon germanium portions with the dielectric portions, the metal portion of the gate electrode can be covered with the first spacers and the high-k portion. When replacing the silicon germanium portions with the dielectric portions, the side surfaces of the metal portion of gate electrode can be covered with the first spacers. The method can further involve replacing the first gate electrode with a second gate electrode. Replacing the first gate electrode with the second gate electrode involves removing the first gate electrode and forming a second high-k portion over the silicon fins in the gate region, a second metal portion over the second high-k portion, and a second polysilicon portion over the second metal portion.

Although not illustrated in Figures, the subject innovation can provide hybrid logic circuits including the multi-gate metal oxide silicon transistors and another type of transistor. For example, hybrid logic circuits contain the subject double- or tri-gate finFET, and planar MOSFET. In the hybrid logic circuits, a depth of shallow trench isolation of double- or tri-gate finFET is smaller than a depth of the planar MOSFET.

What has been described above includes examples of the disclosed innovation. It is, of course, not possible to describe every conceivable combination of components or methodologies for purposes of describing the disclosed innovation, but one of ordinary skill in the art can recognize that many further combinations and permutations of the disclosed innovation are possible. Accordingly, the disclosed innovation is intended to embrace all such alterations, modifications and variations that fall within the spirit and scope of the appended claims. Furthermore, to the extent that the term "contain," "includes," "has," "involve," or variants thereof is used in either the detailed description or the claims, such term can be inclusive in a manner similar to the term "comprising" as "comprising" is interpreted when employed as a transitional word in a claim.

What is claimed is:

1. A multi-gate metal oxide silicon transistor, comprising:
   a silicon substrate comprising a convex portion between shallow trench regions;
   a dielectric portion over the convex portion;
   a silicon fin over the dielectric portion;
   a shallow trench isolation layer in the shallow trench isolation region, the upper surface of the shallow trench isolation layer being located below the upper surface of the convex portion;
   a laterally grown silicon portion on a side surface of the silicon fin in a source/drain region that is protruded laterally from the silicon fin in the source/drain region;
   a gate electrode provided over the silicon fin via a gate dielectric layer in a gate electrode region;
   first spacers adjacent to the side surfaces of the gate electrode; and
   second spacers adjacent to side surfaces of the convex portion in the source/drain region.

2. The multi-gate metal oxide silicon transistor of claim 1, wherein the gate electrode includes a metal portion over the gate dielectric layer, and a polysilicon portion on the metal portion, and the side surfaces of metal portion of gate electrode are covered with the first spacers.

3. The multi-gate metal oxide silicon transistor of claim 1, wherein the side surfaces of the convex portion in the source/drain region are covered with the second spacers.

4. The multi-gate metal oxide silicon transistor of claim 1 further comprising mask portion over the silicon fin.

5. The multi-gate metal oxide silicon transistor of claim 1 wherein the laterally grown silicon portion is in contact with the first spacers or the second spacers.

6. A multi-gate metal oxide silicon transistor, comprising:
   a silicon substrate comprising a convex portion between shallow trench isolation regions;
   a dielectric portion over the convex portion;
   a silicon fin over the dielectric portion;
   a shallow trench isolation layer in the shallow trench isolation regions, the upper surface of the shallow trench isolation layer being located between the lower surface and the upper surface of first dielectric layer;

a laterally grown silicon portion on a side surface of the silicon fin in a source/drain region that is protruded laterally from the silicon fin in the source/drain region;

a gate electrode provided over the silicon fin via a gate dielectric layer in a gate electrode region;

first spacers adjacent to the side surfaces of the gate electrode; and shallow trench isolation layer between the convex portions.

7. The multi-gate metal oxide silicon transistor of claim 6, wherein the gate electrode includes a metal portion over the gate dielectric layer, and a polysilicon portion on the metal portion, and the side surfaces of metal portion of gate electrode are covered with the first spacers.

8. The multi-gate metal oxide silicon transistor of claim 6, wherein the side surfaces of the convex portion in the source/drain region are covered with the shallow trench isolation layer.

9. The multi-gate metal oxide silicon transistor of claim 6 further comprising mask portion over the silicon fin.

10. The multi-gate metal oxide silicon transistor of claim 6 wherein the laterally grown silicon portion is in contact with the first spacer or the second spacer.

11. A method of making a multi-gate metal oxide silicon transistor, comprising:

forming a silicon germanium layer over a silicon substrate, and forming a silicon layer over the silicon germanium layer;

forming shallow trench isolation regions, thereby forming, between the shallow trench isolation regions, a convex portion of the silicon substrate, a silicon germanium portion over the convex portion, and a silicon fin over the silicon germanium portion;

forming a shallow trench isolation layer in the shallow trench isolation regions, the upper surface of the shallow trench isolation layer being located below the upper surface of the convex portion;

forming a first gate electrode over the silicon fin via a first gate dielectric layer;

forming first spacers adjacent to the side surfaces of the first gate electrode;

replacing the silicon germanium portion with a dielectric portion;

forming second spacers adjacent to the side surfaces of the convex portion; and laterally growing a silicon portion from the silicon fin in a source/drain region.

12. The method of making the multi-gate metal oxide silicon transistor of claim 11, wherein the first gate electrode includes a metal portion over the first gate dielectric layer, and when replacing the silicon germanium portion with the dielectric portion, the metal portion of the gate electrode is covered with the first spacer and the first gate dielectric layer.

13. The method of making the multi-gate metal oxide silicon transistor of claim 11, wherein the first gate electrode includes a metal portion over the first gate dielectric layer, and when replacing the silicon germanium portion with the dielectric portion, the side surfaces of the metal portion of gate electrode are covered with the first spacers.

14. The method of making the multi-gate metal oxide silicon transistor of claim 11, wherein when laterally growing the silicon portion from the silicon fin in the source/drain region, the silicon portion is grown so as to be in contact with the first spacer or the second spacer.

15. The method of making the multi-gate metal oxide silicon transistor of claim 11, wherein replacing the first gate electrode with the second gate electrode comprises removing the first gate electrode and forming a second gate dielectric layer over the silicon fin in the gate region, a second metal portion over the second gate dielectric layer, and a second polysilicon portion over the second metal portion.

16. A method of making a multi-gate metal oxide silicon transistor, comprising:

forming a semiconductor layer over a silicon substrate, a silicon germanium layer over the bulk semiconductor layer, and a silicon layer over the silicon germanium layer;

forming shallow trench isolation regions, thereby forming, between the shallow trench isolation regions, a convex portion of the bulk silicon substrate, a silicon germanium portion over the convex portion, and a silicon fin over the silicon germanium portion;

forming a shallow trench isolation layer in the shallow trench isolation regions, the upper surface of the shallow trench isolation layer being located between the lower surface and the upper surface of the silicon germanium portion;

forming a first gate electrode over the silicon fin via a first gate dielectric layer;

forming first spacers adjacent to the side surfaces of the first gate electrode;

replacing the silicon germanium portion with a dielectric portion; and laterally growing a silicon portion from the silicon fin in a source/drain region.

17. The method of making the multi-gate metal oxide silicon transistor of claim 16, wherein the first gate electrode includes a metal portion over the first gate dielectric layer, and when replacing the silicon germanium portion with the dielectric portion, the metal portion of the gate electrode is covered with the first spacer and the first gate dielectric layer.

18. The method of making the multi-gate metal oxide silicon transistor of claim 16, wherein the first gate electrode includes a metal portion over the first gate dielectric layer, and when replacing the silicon germanium portion with the dielectric portion, the side surfaces of the metal portion of gate electrode are covered with the first spacers.

19. The method of making the multi-gate metal oxide silicon transistor of claim 16, wherein when laterally growing the silicon portion from the silicon fin in the source/drain region, the silicon portion is grown so as to be in contact with the first spacers or the second spacers.

20. The method of making the multi-gate metal oxide silicon transistor of claim 16, wherein replacing the first gate electrode with the second gate electrode comprises removing the first gate electrode and forming a second gate dielectric layer over the silicon fin in the gate region, a second metal portion over the second gate dielectric layer, and a second polysilicon portion over the second metal portion.

* * * * *